(12) United States Patent
Huang et al.

(10) Patent No.: US 8,897,470 B2
(45) Date of Patent: Nov. 25, 2014

(54) METHOD OF FABRICATING INTEGRATED SEMICONDUCTOR DEVICE WITH MOS, NPN BJT, LDMOS, PRE-AMPLIFIER AND MEMS UNIT

(75) Inventors: Hsueh-I Huang, Kaohsiung County (TW); Ming-Tung Lee, Taoyuan County (TW); Shuo-Lun Tu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 1059 days.

(21) Appl. No.: 12/533,055

(22) Filed: Jul. 31, 2009

(65) Prior Publication Data

US 2011/0026742 A1  Feb. 3, 2011

(51) Int. Cl.
*H04R 17/02* (2006.01)
*B81C 1/00* (2006.01)

(52) U.S. Cl.
CPC ..... *B81C 1/00246* (2013.01); *B81B 2201/0257* (2013.01); *B81C 2203/0778* (2013.01)
USPC .......................................... 381/174; 381/175

(58) Field of Classification Search
USPC ............. 381/174, 175; 438/53; 257/E21.085; 29/594
See application file for complete search history.

(56) References Cited

U.S. PATENT DOCUMENTS

| | | | | |
|---|---|---|---|---|
| 6,207,484 B1 * | 3/2001 | Kim et al. | ....... | 438/209 |
| 6,320,239 B1 * | 11/2001 | Eccardt et al. | ....... | 257/415 |
| 7,067,856 B2 | 6/2006 | Ramdani et al. | | |
| 7,205,173 B2 | 4/2007 | Brunson et al. | | |
| 2002/0173064 A1 | 11/2002 | Ogawa et al. | | |
| 2005/0179111 A1 * | 8/2005 | Chao | ....... | 257/510 |
| 2006/0110842 A1 * | 5/2006 | Chang et al. | ....... | 438/51 |
| 2006/0237806 A1 | 10/2006 | Martin et al. | | |
| 2007/0160234 A1 * | 7/2007 | Deruginsky et al. | ....... | 381/113 |
| 2008/0049953 A1 * | 2/2008 | Harney et al. | ....... | 381/94.7 |
| 2008/0137884 A1 * | 6/2008 | Kim et al. | ....... | 381/174 |
| 2008/0246534 A1 * | 10/2008 | Fujito et al. | ....... | 327/535 |
| 2009/0060232 A1 * | 3/2009 | Hirade et al. | ....... | 381/174 |
| 2010/0027830 A1 * | 2/2010 | Hsu et al. | ....... | 381/355 |

OTHER PUBLICATIONS

TW Office Action dated May 27, 2013.

\* cited by examiner

*Primary Examiner* — Ahmad Matar
*Assistant Examiner* — Katherine Faley
(74) *Attorney, Agent, or Firm* — McClure, Qualey & Rodack, LLP

(57) ABSTRACT

A method of fabricating an integrated semiconductor device, comprising: providing a substrate having a first region and a second region; and forming a semiconductor unit on the first region and forming a micro electro mechanical system (MEMS) unit on the second region in one process.

7 Claims, 25 Drawing Sheets

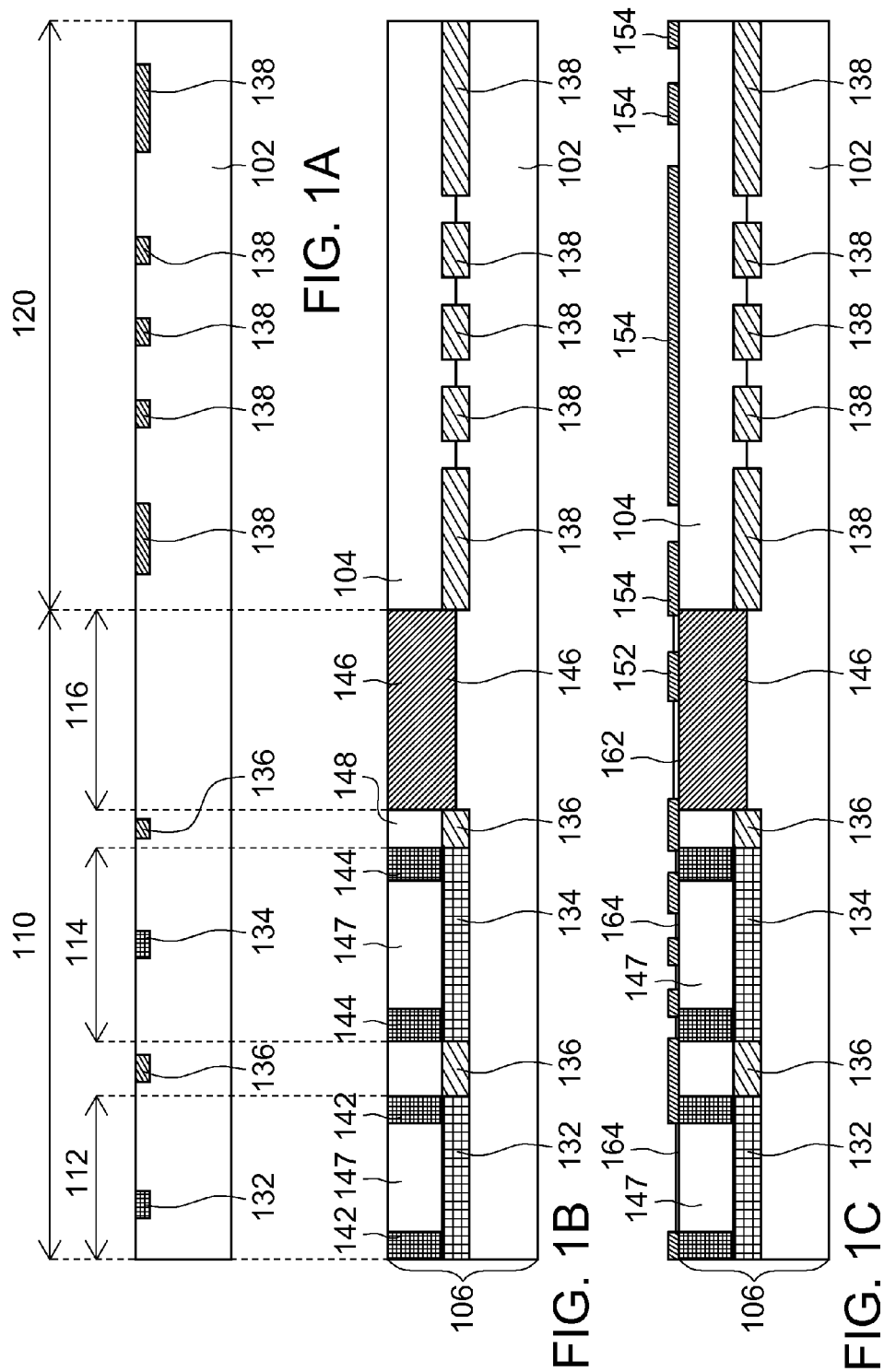

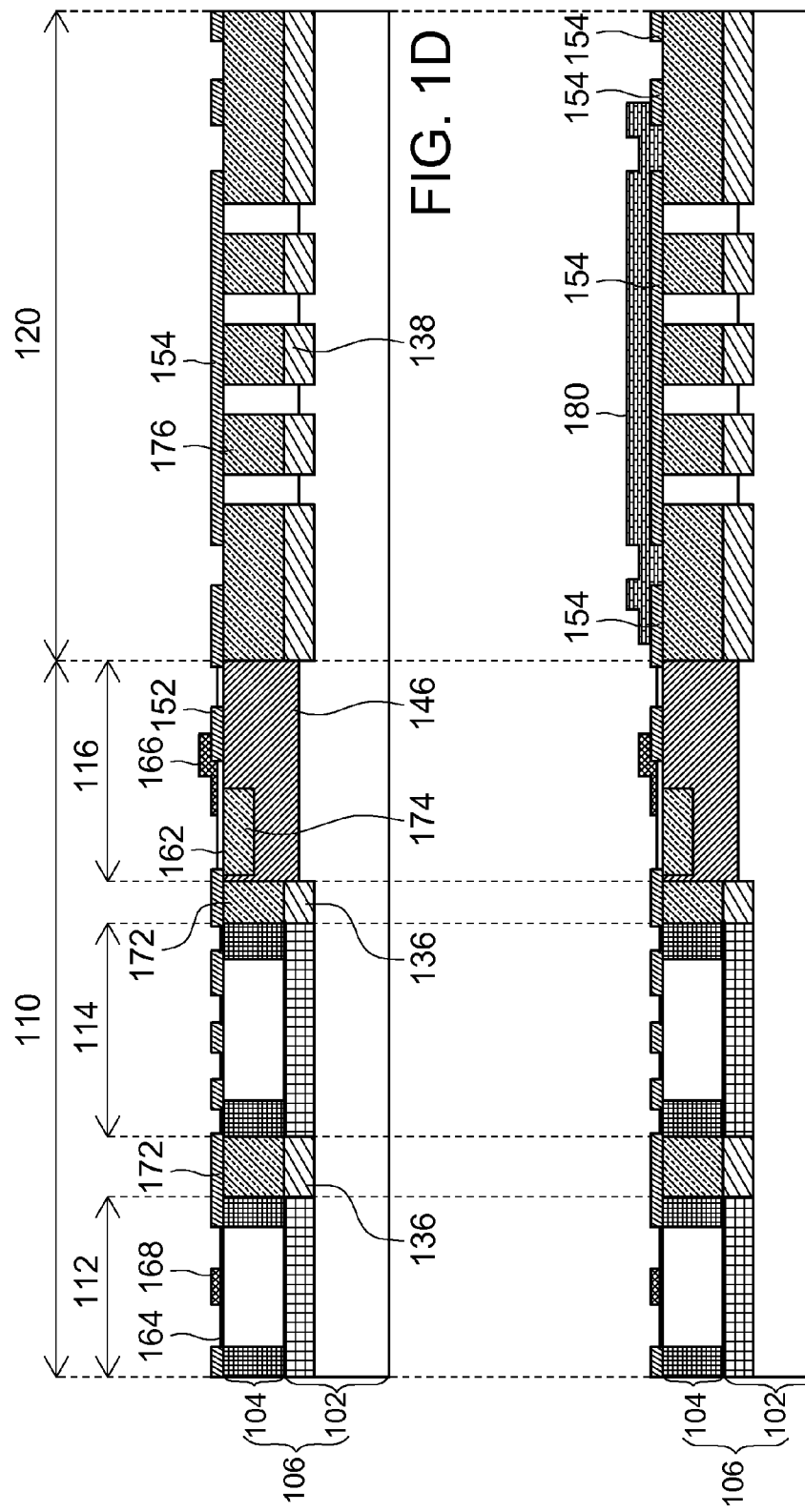

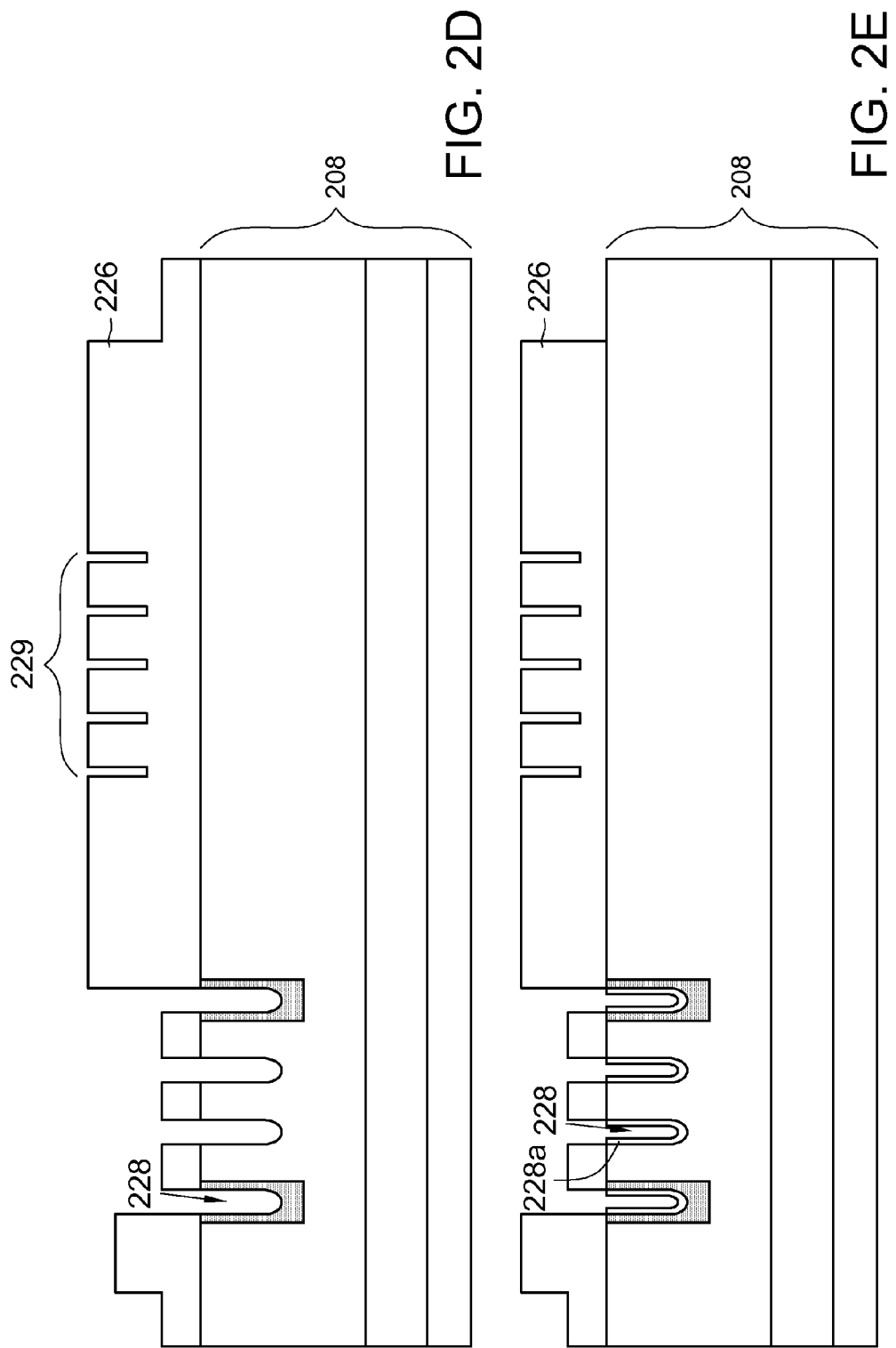

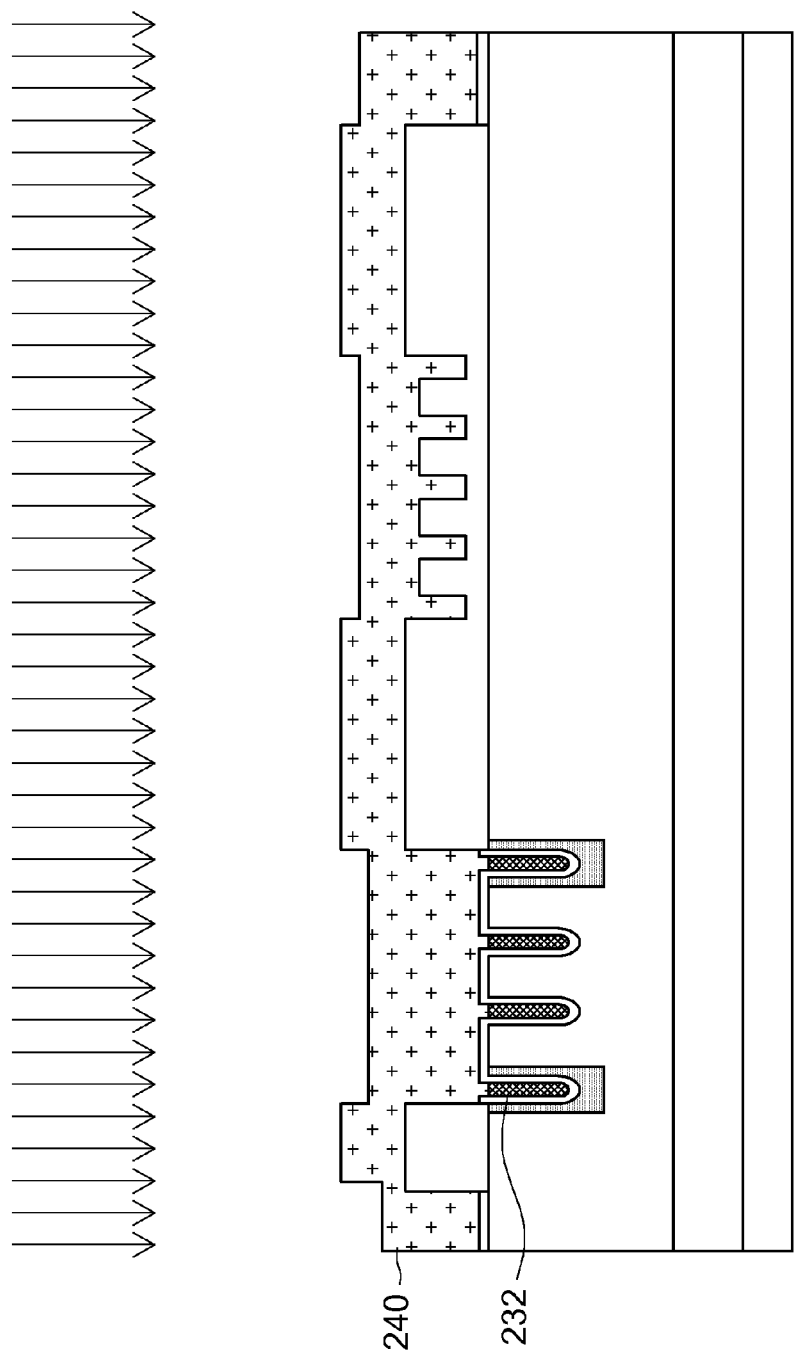

METHOD OF FABRICATING INTEGRATED SEMICONDUCTOR DEVICE WITH MOS, NPN BJT, LDMOS, PRE-AMPLIFIER AND MEMS UNIT

BACKGROUND OF THE INVENTION

1. Field of the Invention

The invention relates in general to a method of fabricating an integrated semiconductor device and an structure thereof, and more particularly to a method of fabricating an integrated semiconductor device, which integrates the semiconductor fabrication into the MEMS fabrication, and an structure thereof.

2. Description of the Related Art

A microphone of MEMS design is known from U.S. Pat. No. 5,490,220 A by way of example. The signal processing of the microphone requires integrated circuits in the form of semiconductor components, known MEMS microphones typically being incorporated into a common package and thus constituting hybrid components. A further possibility consists in integrating an MEMS microphone together with an IC component in a module. In all cases, however, microphones are obtained which require a relatively large silicon or semiconductor area and which can therefore be housed or incorporated into a package only in a complicated manner. Conventionally, the microphone is formed on one chip, the IC component is formed on anther chip. At least two chips are packaged in one module. However, such module having microphones which require a relatively large silicon or semiconductor area has larger size or must be packaged in a complicated manner, as a result of increased cost and complicated fabrication.

SUMMARY OF THE INVENTION

The invention is directed to a method of fabricating an integrated semiconductor device, in which the semiconductor fabrication integrated into the MEMS fabrication. The semiconductor unit and the MEMS unit are formed on one chip by one process.

According to a first aspect of the present invention, a method of fabricating an integrated semiconductor device is provided. The method comprises: providing a substrate having a first region and a second region; and forming a semiconductor unit on the first region and forming a micro electro mechanical system (MEMS) unit on the second region in one process.

According to a second aspect of the present invention, an integrated semiconductor device is provided. The integrated semiconductor device comprises a substrate, a semiconductor unit, and a micro electro mechanical system (MEMS) unit. The substrate has a first region and a second region. The semiconductor unit is formed on the first region. The micro electro mechanical system (MEMS) unit is formed on the second region. The semiconductor unit and the MEMS unit are fabricated in one process.

The invention will become apparent from the following detailed description of the preferred but non-limiting embodiments. The following description is made with reference to the accompanying drawings.

BRIEF DESCRIPTION OF THE DRAWINGS

FIG. 1A~1G schematically illustrate the method of fabricating an integrated semiconductor device according to the first embodiment of the present invention.

DETAILED DESCRIPTION OF THE INVENTION

The invention is directed to a method of fabricating an integrated semiconductor device, including following steps. A substrate having a first region and a second region is provided. A semiconductor unit is formed on the first region, and a micro electro mechanical system (MEMS) unit is formed on the second region in one process. The process integrates the semiconductor fabrication into the MEMS fabrication, and the characteristics of the semiconductor unit and the MEMS unit is also improved in many ways as disclosed below.

First Embodiment

Figure 1F:
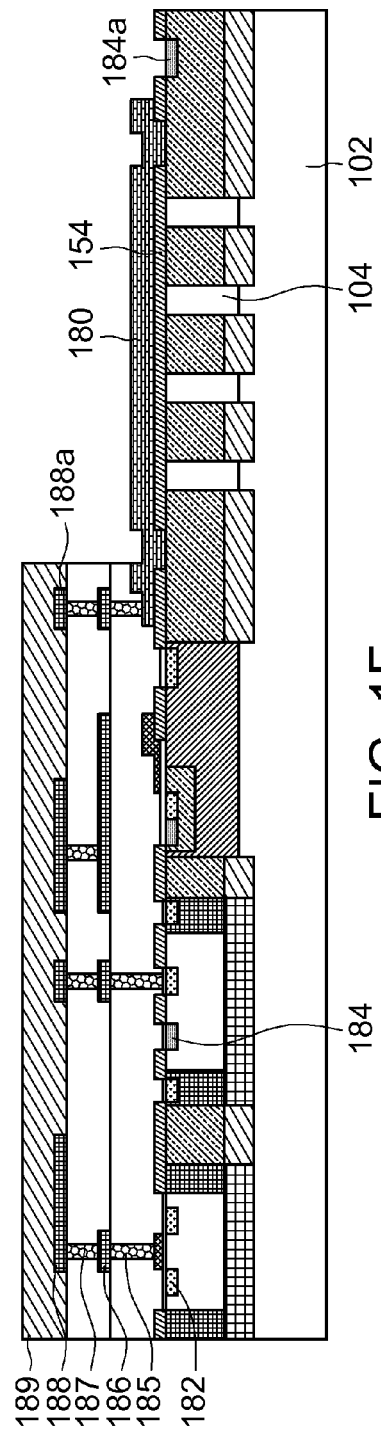

A method of fabricating an integrated semiconductor device, e.g. NMOS, NPN bipolar junction transistor (NPN BJT), LDNMOS and a microphone on one chip, is provided in the first embodiment of the present invention. Referring to FIG. 1A~1G, illustrating the method of fabricating an integrated semiconductor device according to the first embodiment of the present invention. Firstly a substrate (as 106 shown in FIG. 1B) is provided by following steps. The substrate 106 is divided into two regions: a first region 110 in which at least one semiconductor unit (e.g. LDNMOS) is formed and a second region 120 at which at least one MEMS unit (e.g. microphone) is formed. The first region 110 has a first portion 112, a second portion 114 and a third portion 116, and the third portion 116 is adjacent to the second region 120. As shown in FIG. 1A, a P-type doped silicon layer 102 is provided. N-type dopant, e.g. arsenic (As), is implanted into and driven in the silicon layer 102 to form N-type barrier layers (NBL) 132 and 134 in the first portion 112 and second portion 114 respectively. P-type dopant, e.g. boron (B), is implanted into and driven in the silicon layer 102 to form a P-type barrier layer (PBL) 136 between the first and the second portions 112 and 114, a PBL 136 between the second and third portions 114 and 116, several separated PBL 138 in the second region 120. Then, a P-type epi layer 104 is formed on the silicon layer 102, as shown in FIG. 1B. N-type dopant is implanted into the epi layer 104 to form two N well 142 in the first portion 112, two N wells 144 in the second portion 114, a high voltage N well (HVNW) in the third portion 116. P-type dopant is implanted into the epi layer 104 to form two P-type well 148 on the NBL 132 and 134, two P-type well 148 on the PBLs 136 in the first region 110. A drive-in step is performed to active the dopant, and dopants are diffused in the silicon layer 102 and the epi layer 104 to form the substrate 106 as shown in FIG. 1B. The first region 110 of the substrate is divided into three portions 112, 114 and 116, at which NMOS, NPN BJT and LDNMOS will be formed respectively. The rest of the first region 110 (i.e. portions between the first and second portions 112 and 114, a portion between the second and third portions 114 and 116) is defined by the PBL 136 are used for isolation from each semiconductor units. The MEMS unit, i.e. microphone, will be formed at the second region 120 of the substrate.

Next, p-type dopant is implanted into the n-type epi layer 104 while covering the photoresist (not shown) with corresponding pattern, and therefore the p-type wells 147 are formed in the first region 110 as shown in FIG. 1B. It allows to increase the concentration of the dopant in the p-type well, as a result of preventing the punch problem or adjusting the characteristics of the semiconductor unit. Then, field oxidation is performed while covering the same photoresist, so that field oxide layers 152 and 154 are formed on the unmasked the substrate 106, as shown in the FIG. 1C. In particular, the filed oxide layer 152 is formed on the HVNW 146 for electrically isolation, and the field oxide layer 154 is located on the epi layer 104 in the second region 120. Afterwards, a thick gate oxide layer 162 is formed on the exposed surface of the HVNW 146, such as 450 angstroms. A thin gate oxide layer 164 is formed on the exposed surface of the p-type wells 147, such as 115 angstroms. Gate oxide layers of different semiconductor units are sequentially formed, so that the respectively electrical characteristics can be performed.

A polysilicon layer, i.e., 166/168, is deposited on the substrate, and then etched according to a patterned photoresist layer so as to serve as gate electrode of the semiconductor unit. Tungsten silicide layer is preferably deposited on the polysilicon layer 166/168, and total thickness is about 2700 angstroms. A patterned polysilicon layer 166/168 is formed in the first portion 112 and the third portion 116, as shown in FIG. 1D. In the third portion 116, the polysilicon layer 166 is formed on the thick gate oxide layer 162 and part of the field oxide layer, and serves as gate electrode in the LDNMOS. In the first portion 112, the polysilicon layer 168 is formed on the thin gate oxide layer 164 and serves as gate electrode in the NMOS.

Next, p-type dopant, e.g. boron, is implanted into the epi layer 104 while covering the photoresist (not shown) with corresponding pattern. Dopant is blocked by the photoresist and the polysilicon layer 166 and 168, but penetrate through the filed oxide layer e.g. 154 and the gate oxide layer 162. dopants can also be implanted into the substrate under the polysilicon layer 166 by performing the implantation with an angle of about 45 degree between the substrate 106 and rotating the whole device horizontally. Accordingly, p-body 172 is formed on the PBL 136 in the first region 110, p-body 174 is formed on in the HVNW 146, and several p-body 176 are formed on the PBL 138 in the second region 120. The concentration of p-type dopant, e.g. boron, in the p-body 172/174/176 and PBL 136/138 is higher than that in p-type epi layer 104 since they undergo additional implantation.

Then, a layer made of polysilicon is deposited on the substrate 106 and then pattered, and a polysilicon layer 180 is formed on the pattened field oxide layer 154 and the epi layer 104 in the second region 120. A layer of high temp oxide (not shown) is preferably formed prior to the polysilicon layer 180. The thickness of the high temp oxide is about 370 Å, and the thickness of the polysilicon layer is about 1800 Å.

Next, the fabrication for semiconductor units is performed. A serial of steps, such as implantation of n-type dopant to form heavily doped N well 182 which serves as source/drain region in the NMOS or HVNW, implantation of p-type dopant to form heavily doped N well 184, etching contact hole and forming contact 185, deposition of first metal layer 186, etching via hole and forming via 187, deposition of second metal layer 188 and deposition of passivation layer 189, are sequentially performed, as shown in FIG. 1F. So far a NMOS, NPN BJT and LDNMOS are completed in the first portion 112, the second portion 114 and the third portion 116 respectively. In addition, the electrode 188a and 184a in contact with microphone are also formed during the semiconductor fabrication. Afterwards, the passivation layer 189 is patterned to form a window for testing, which is a conventional step in the semiconductor fabrication, and also to expose the second region 120 for following MEMS fabrication.

Figure 1G:
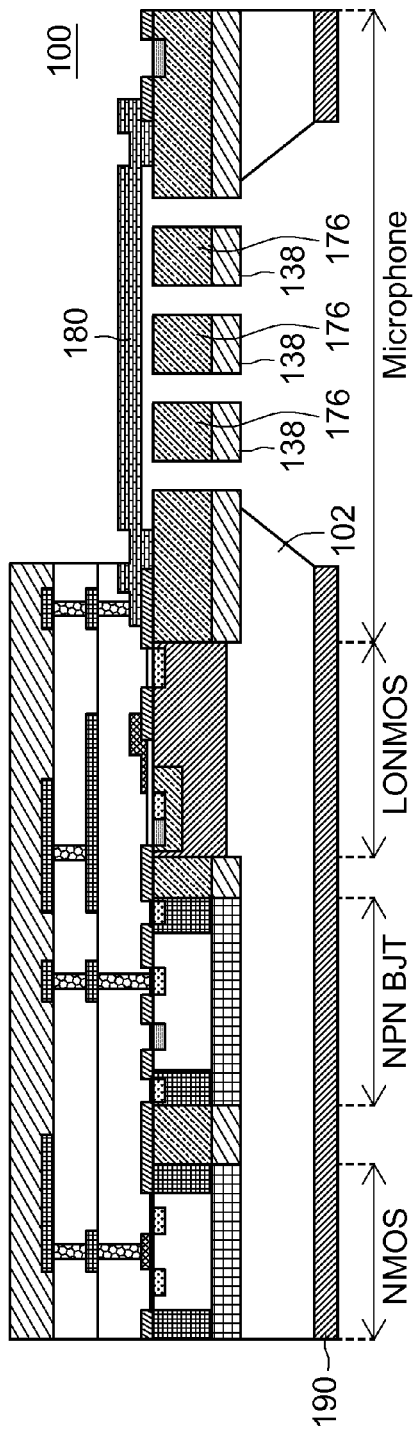

A wafer backside grinding is performed to remove part of the silicon layer 102. The patterned photoresist layer 190 is formed to expose the backside of the second region 120 of the substrate 106, as shown in FIG. 1G. Afterwards, the substrate 106 is etched by an etchant with selectivity of the silicon layer of low concentration of p-type dopant to that of high concentration. The etchant preferably is KOH, whose etching rate to the silicon layer 102 and epi layer 104 is much faster than that to the PBL 138 and p-body 176. Next, the field oxide layer 154 as well as the high temp oxide is further etched, and the etchant is preferably buffer oxide etching solution (BOE), which including HF, $H_2O_2$ and de-ionized water. The polysilicon layer 180 therefore has fixed ends and function of vibration to serve as a diaphragm of the MEMS unit. After removing the photoresist layer 190, the integrated semiconductor device according to the first embodiment of the invention The method described above integrates the MEMS fabrication into the high voltage fabrication (i.e. one of the semiconductor fabrication). Some steps are used step in the high voltage fabrication, and they also construct the MEMS unit. For example, formation of p-type barrier layers 136 and p-body 172 between semiconductor units (i.e. NMOS and NPN BJT, NPN BJT and LDNMOS) for isolation, as well as formation of p-body 174 in HVNW 146, is a used step in the high voltage fabrication, and PBLs 138 and p-bodys 176 are simultaneously formed which serve as main body of the acoustic holes in the microphones during this implantation. Formation of the field oxide layer 152 for isolation is a used step in the semiconductor fabrication, and the field oxide layer 154 is simultaneously formed which give shape to the diaphragm (i.e., polysilicon layer 180) in the microphone. Accordingly, only one extra photoresist layer 190 is added to the high voltage fabrication, and then two fabrications can be integrated.

Second Embodiment

Figure 2A:
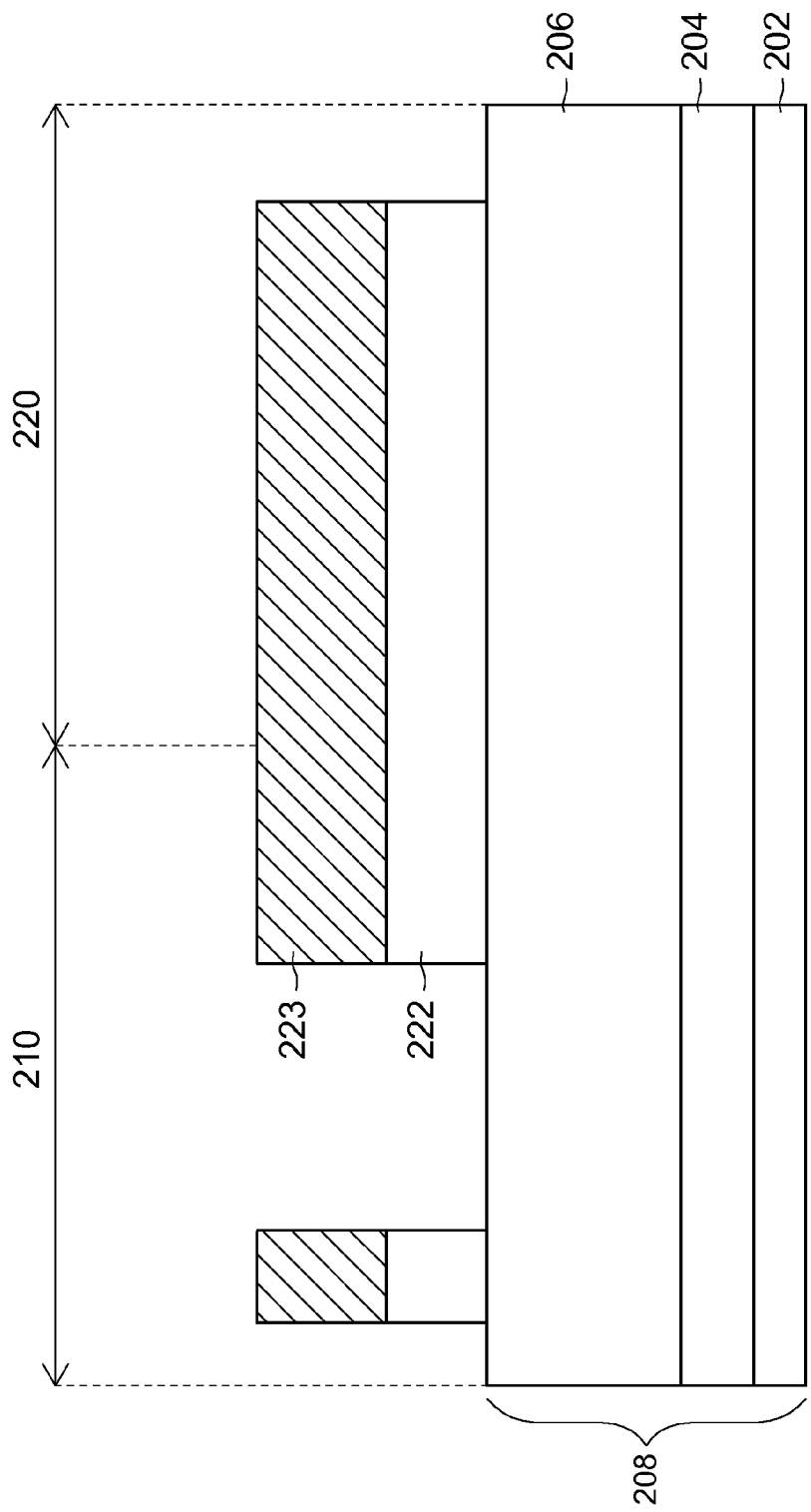
FIG. 2A~2U schematically illustrate the method of fabricating an integrated semiconductor device according to the second embodiment of the present invention.

A method of fabricating an integrated semiconductor device, e.g. pre-amplifier and microphone on one chip, is provided in the second embodiment of the present invention. In the present embodiment, the pre-amplifier is preferably a trench type power MOSFET (Metal-Oxide-Semiconductor Field-Effect Transistor) pre-amplifier. Referring to FIG. 2A~2U, illustrating the method of fabricating an integrated semiconductor device according to the second embodiment of the present invention. Firstly, a substrate 208 including an oxide layer 202, a n-type silicon layer 204 formed on the oxide layer 202 and a n-type epi layer 206 formed on the n-type silicon layer 204 is provided. The substrate 208 is divided into two regions: a first region 210 in which at least one semiconductor unit (e.g. pre-amplifier) is formed and a second region 220 at which at least one MEMS unit (e.g. microphone) is formed. An initial oxide layer 222 of about 7000 Å is deposited on the substrate 208 and then etched according to the photoresist layer 223, as shown in FIG. 2A.

Figure 2B:
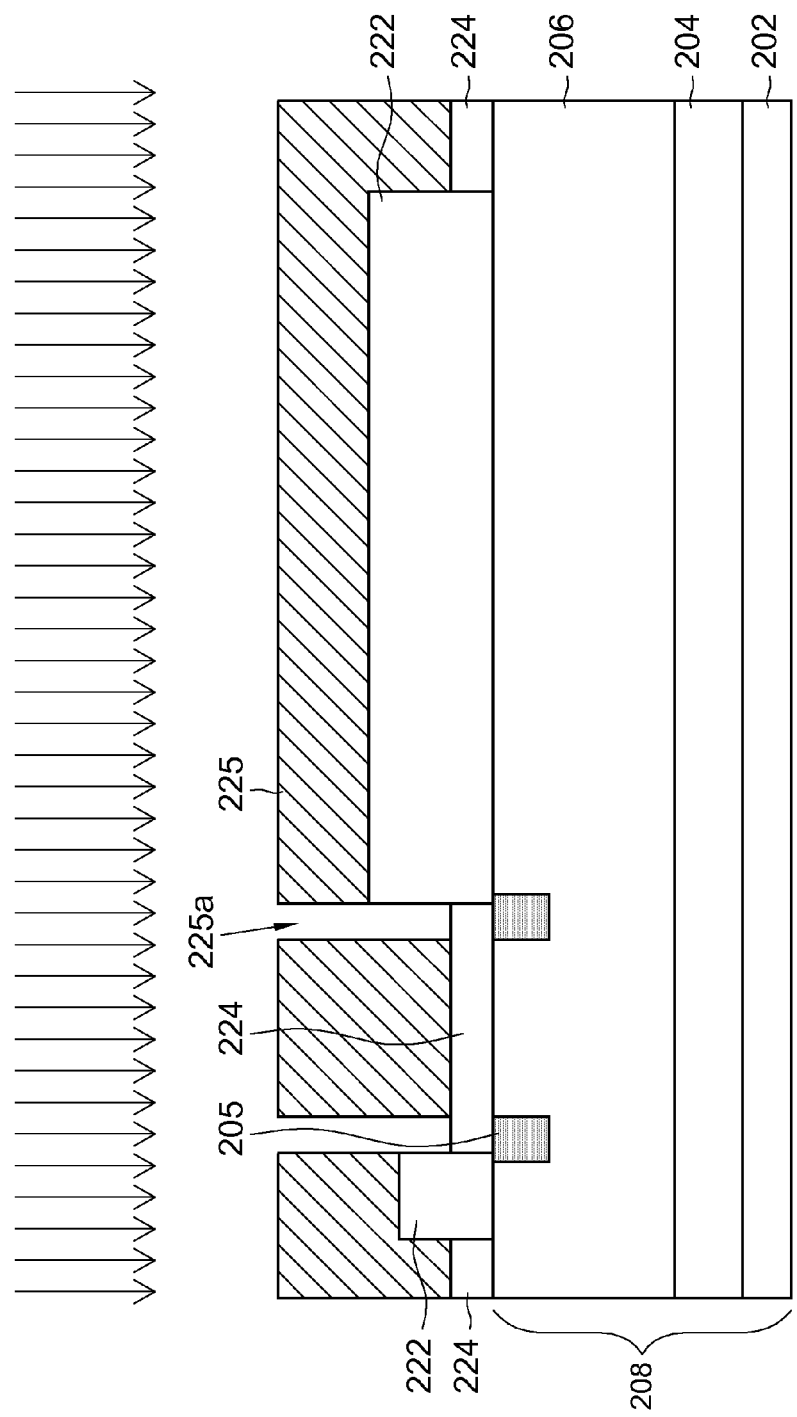
Figure 2C:
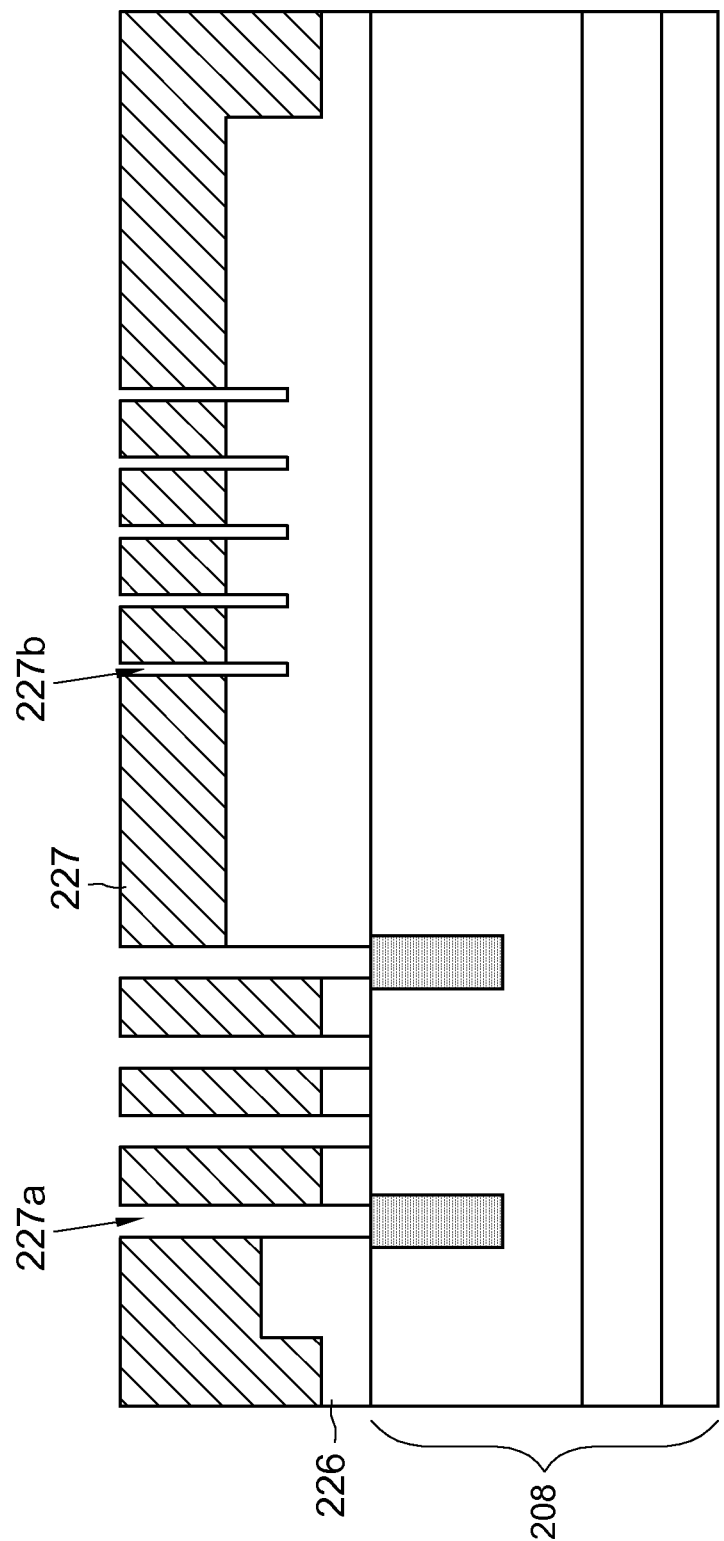

Referring to FIG. 2B, a pad oxide layer 224 of about 300 Å is deposited on the substrate 208. The pad oxide layer 224 formed in the first region 210 is thinner than the initial oxide layer 222 in the second region 220. Afterwards, a patterned photoresist layer 225 is formed on the oxide layer 222 and 224, and has two openings to expose the surface of the pad oxide layer 224 in the first region 210. P-type dopant, e.g., boron, is through the pad oxide layer 224 and implanted in the substrate 208, and guard ring 205 is formed at the edge of the semiconductor unit to prevent breakdown. The p-type dopant is preferably boron, the implantation energy is about 90 keV, and the implantation dosage is preferably about $1.5 \times 10^{13}$ atoms/cm². A drive-in step, i.e. heat up to 1150 for 20 minutes, is performed, and the dopant in the guard ring diffused laterally and downward as shown in FIG. 2C.

Another TEOS oxide layer of about 6000 Å is deposited on the initial oxide layer 222 and the pad oxide layer 224 by low pressure chemical vapor deposition (LPCVD). The incorporated oxide layer is labeled as numerical 226 since they are all made of oxide, as shown in FIG. 2C. A patterned photoresist layer 227 having two groups of openings 227a and 227b is formed on the oxide layer 226. One group of openings 227a of the photoresist layer 227 expose the surface of the pad oxide layer 224 in the first region 210, and the other group of the openings 227b expose the oxide layer 226 in the second region 220. The oxide layer 226 is then etched according to the pattern of the photoresist layer 227 until the substrate 208 in the firs region 210 is exposed from the residual oxide layer 226, as shown in FIG. 2C. Since the oxide layer 226 in the first region 210 is thinner than that in the second region 220, the oxide layer 226 in the second region 220 would not be removed away and expose the surface of the substrate 208.

The photoresist layer 227 is removed, as show in FIG. 2D. The exposed substrate 208 is further etched while masked by the oxide layer 226. The oxide layer 226 also lost during the etching step. It forms several trenches 228 in the first region 210 and gives shape to the corrugation of the oxide layer 226 in the second region 220. The depth of the trench 228 is about 1.7~2.2 μm.

Figure 2F:
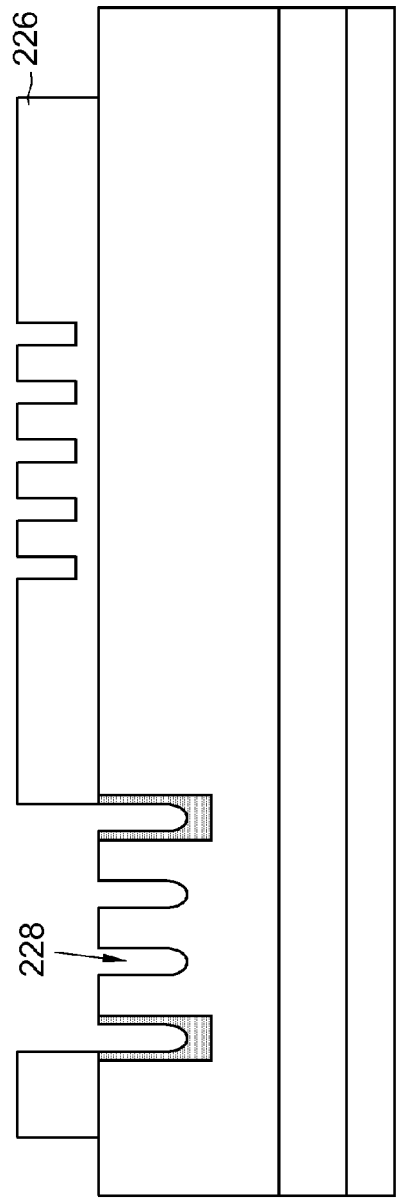

Steps of pre-sacrificed oxidation clean and sacrificed oxidation are performed. The device is heat up to the 1150° C. for 30 minutes. A sacrificed oxide layer 228a is formed in the trench 228 as shown in FIG. 2E. Then the sacrificed oxide layer 228a and the oxide layer 226 are removed by buffer oxide etching solution (B.O.E). After the etching step, the oxide layer 226 becomes thinner, and the corner in the trench 228 is rounded, as shown in FIG. 2F.

Figure 2G:
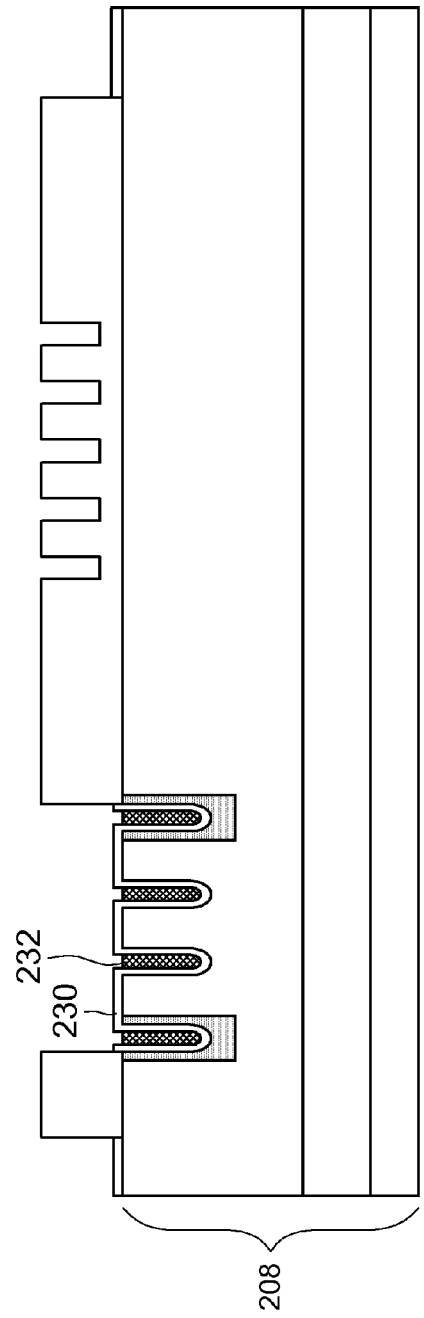
Figure 2I:
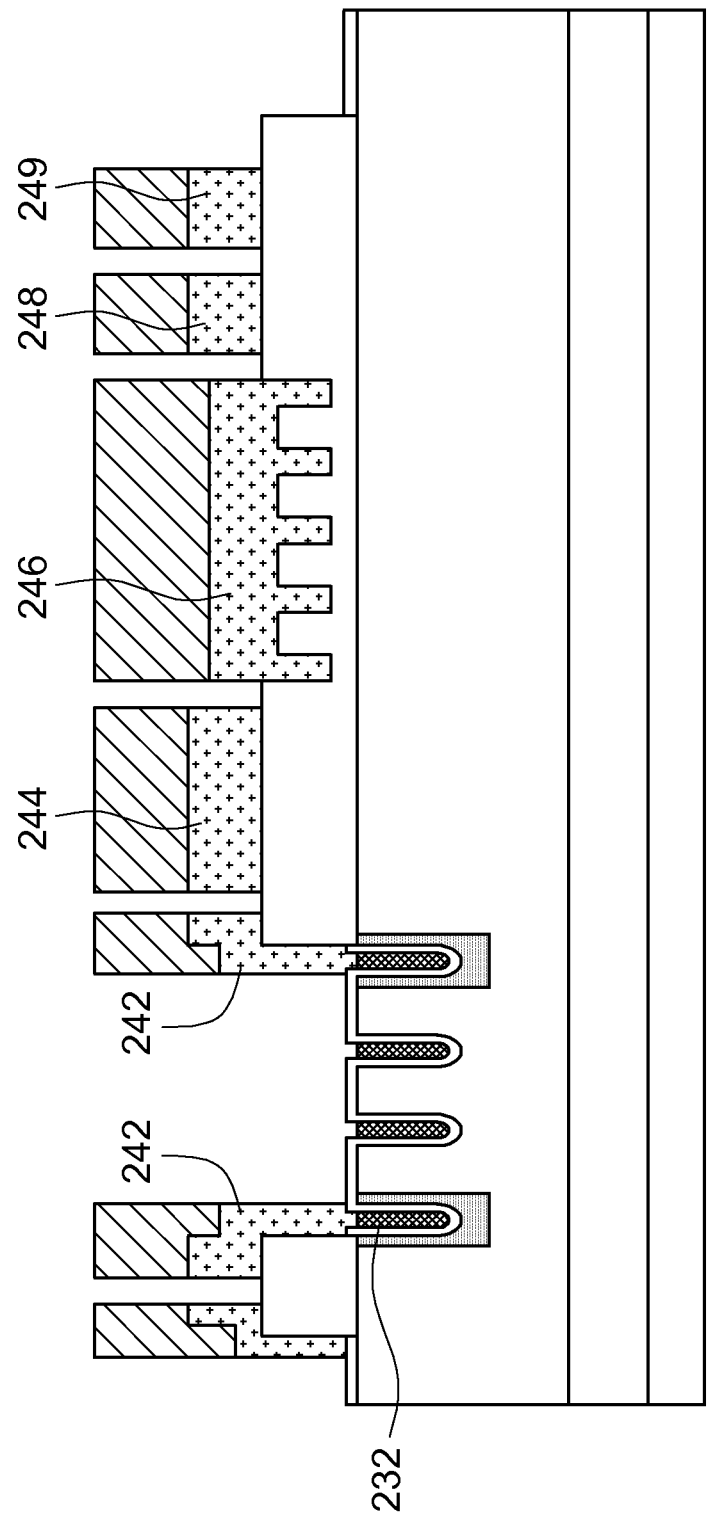

Next, as shown in FIG. 2G, a gate oxidation is performed by heating up to 1000° C. for 87 minutes. The gate oxide layer 230 is formed in the trench 228 and on the substrate 208. The thickness of the gate oxide layer 230 is about 700 Å. Then, a polysilicon layer 232 (in situ doped phosphor ion) of about 7000 Å is deposited and then patterned, so that the doped polysilicon layer 232 is located in the trenches 228 and on the gate oxide layer 230, which serves as gate electrode of the semiconductor unit.

A polysilicon layer 240 of about 7000 Å is deposited on the substrate 208 and the residual oxide layer 226, and then be implanted by p-type dopant, e.g. boron, as shown in FIG. 2H. The implantation energy is about 30 keV, and the implantation dosage is about $7.5 \times 10^{14}$ atoms/cm². The polysilicon layer 240 is then patterned, which serves as different elements in the semiconductor unit and the MEMS unit. It includes the polysilicon layer 242 which serves as conductor electrically connected to the gate electrode 232, the polysilicon layer 244 which serves as main body of the diode pairs, the polysilicon layer 246 which serves as diaphragm of the microphone, the polysilicon layer 248 which serves as input series resistor (Rg) for biasing of the microphone, and the polysilicon layer 249 which serves as loading resistor (Rd) of pre-amplifier. Evidently, it is a step integrated with the semiconductor fabrication and the MEMS fabrication.

Figure 2J:
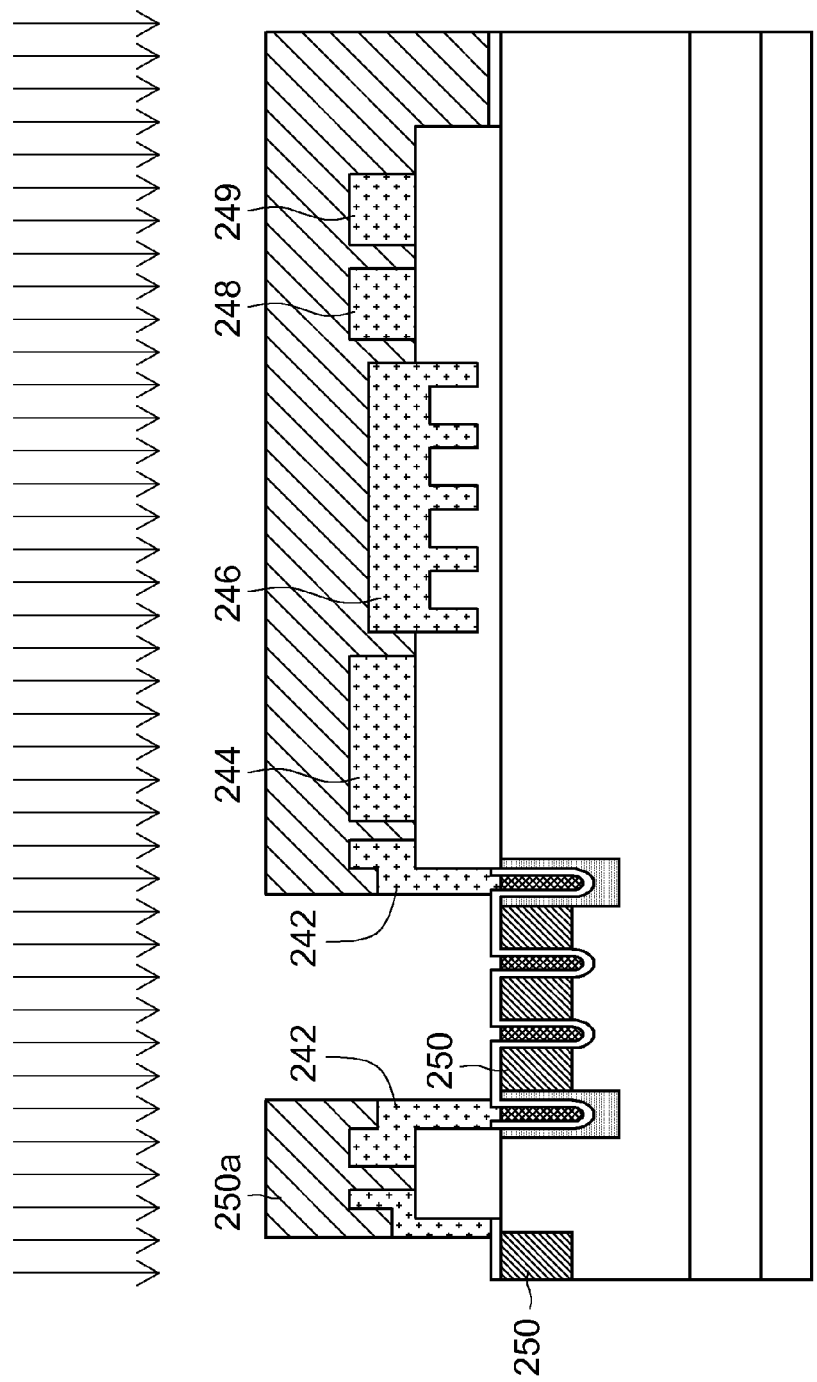
Figure 2K:
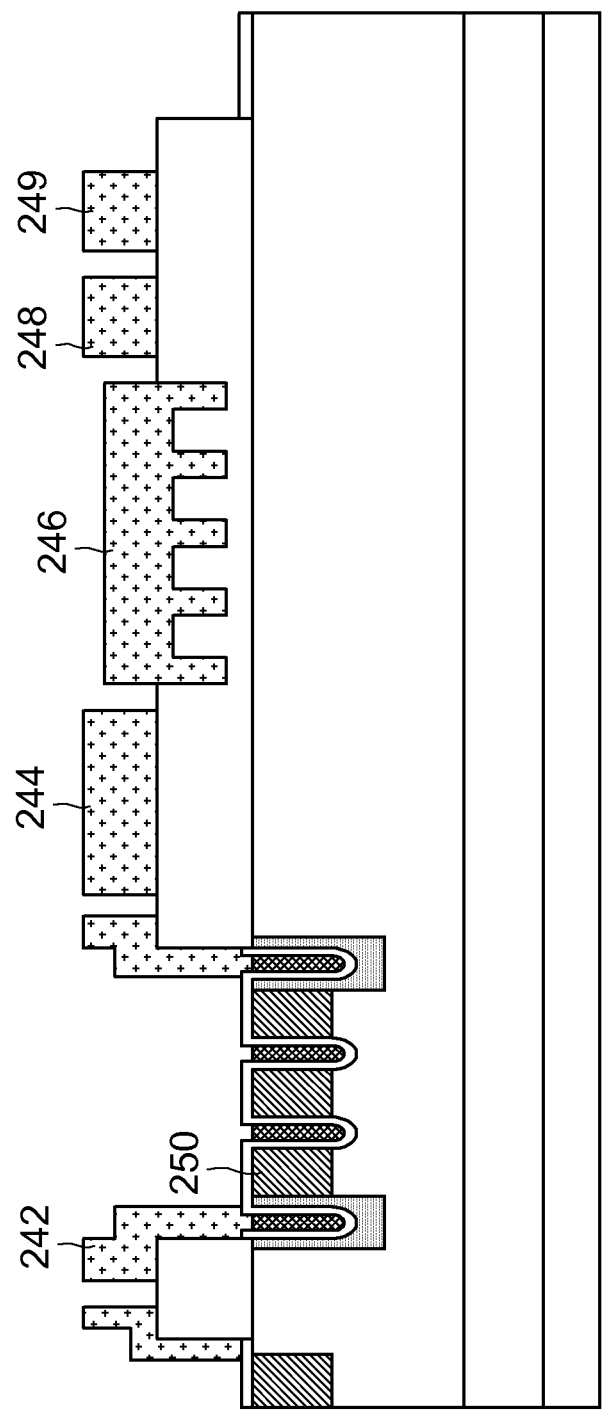
Figure 2L:
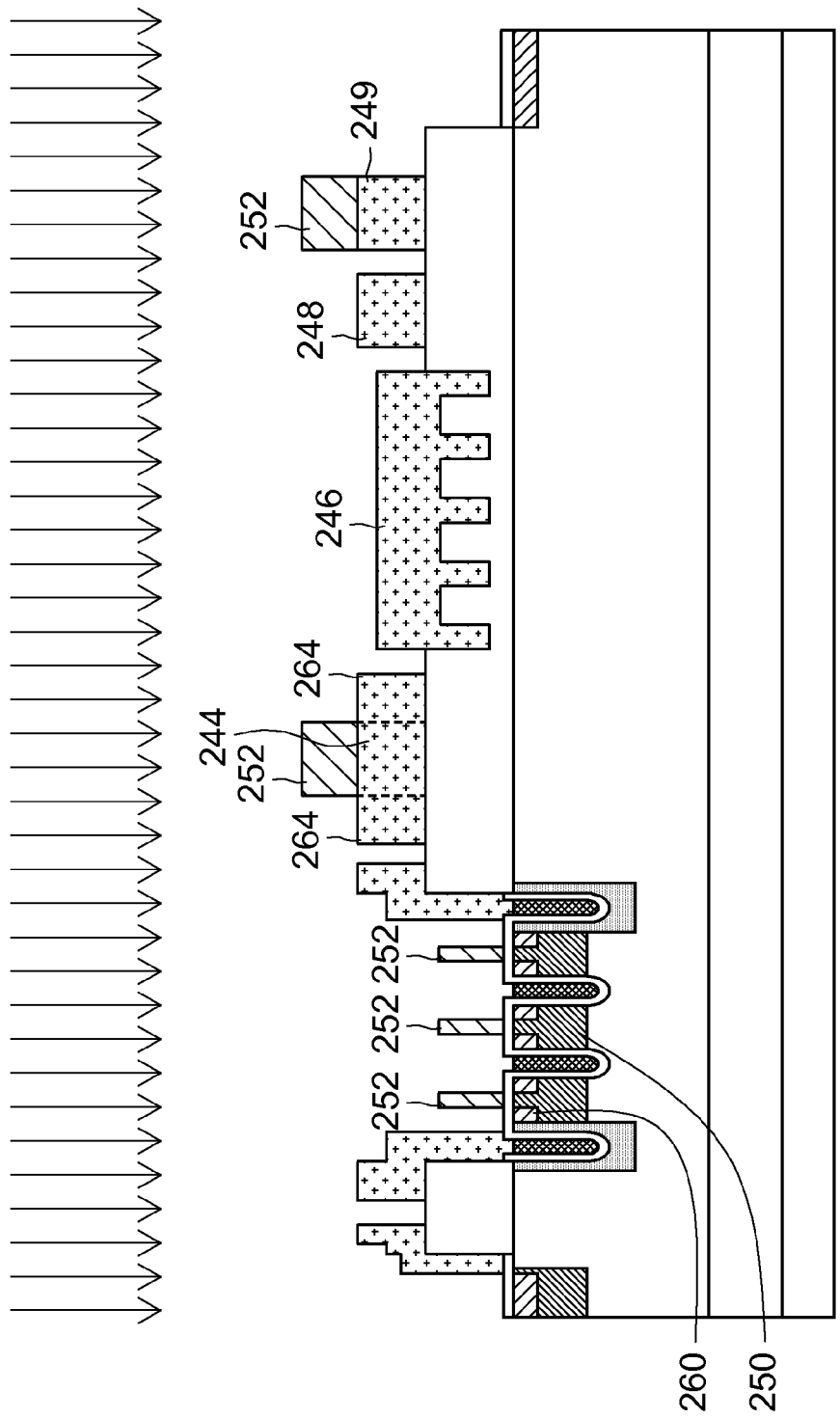

As shown in FIG. 2J, p-type dopant is implanted into the substrate 208 which covering by a patterned photoresist layer 250a, and p-bodys 250 are formed between trenches 228. The implantation energy is about 100 KeV, and the implantation dosage is about $9 \times 10^{12}$ atoms/cm². Afterwards, a drive-in step, i.e., heat up to 1050° C. for 60 minutes, is performed. The p-type dopant of the p-bodys 250 is diffused in the substrate 208 downward, and the stress on polysilicon layer 246 can also be released after the drive-in step. The drive-in step is a used step of the semiconductor fabrication, and it also works on improvement of the diaphragm of the microphone.

The oxide layer produced during the drive-in step is removed by dipping HF. Next, the n-type dopant, e.g., arsenic, is implanted into the substrate 208 and the p-body 250 while covering by a patterned mask 252. The implantation energy is about 60 KeV, and the implantation dosage is about $8 \times 10^{15}$ atom/cm². The heavily n-doped region 260 which serves as source region of the semiconductor unit is therefore formed. N-type dopant is also implanted to part of the p-doped polysilicon layer 244 to define diode. Also, n-type dopant is selectively implanted to the p-type polysilicon layer 248 or 249 to adjust the resistor level. In the present embodiment, the n-type dopant is implanted to the polysilicon layer 248 but not to the polysilicon layer 249, and then the sheet resistance of loading resistor (Rd) 249 will be larger than that of the biasing resistor (Rg) 248. If the dopant concentration of the resistors and diodes can be adjusted by changing the pattern of the mask 252 and implanting respectively, the resistance of these two resistors Rd and Rg and the diodes will be different. It allows the semiconductor unit and the MEMS unit to be matched accordingly.

Figure 2M:
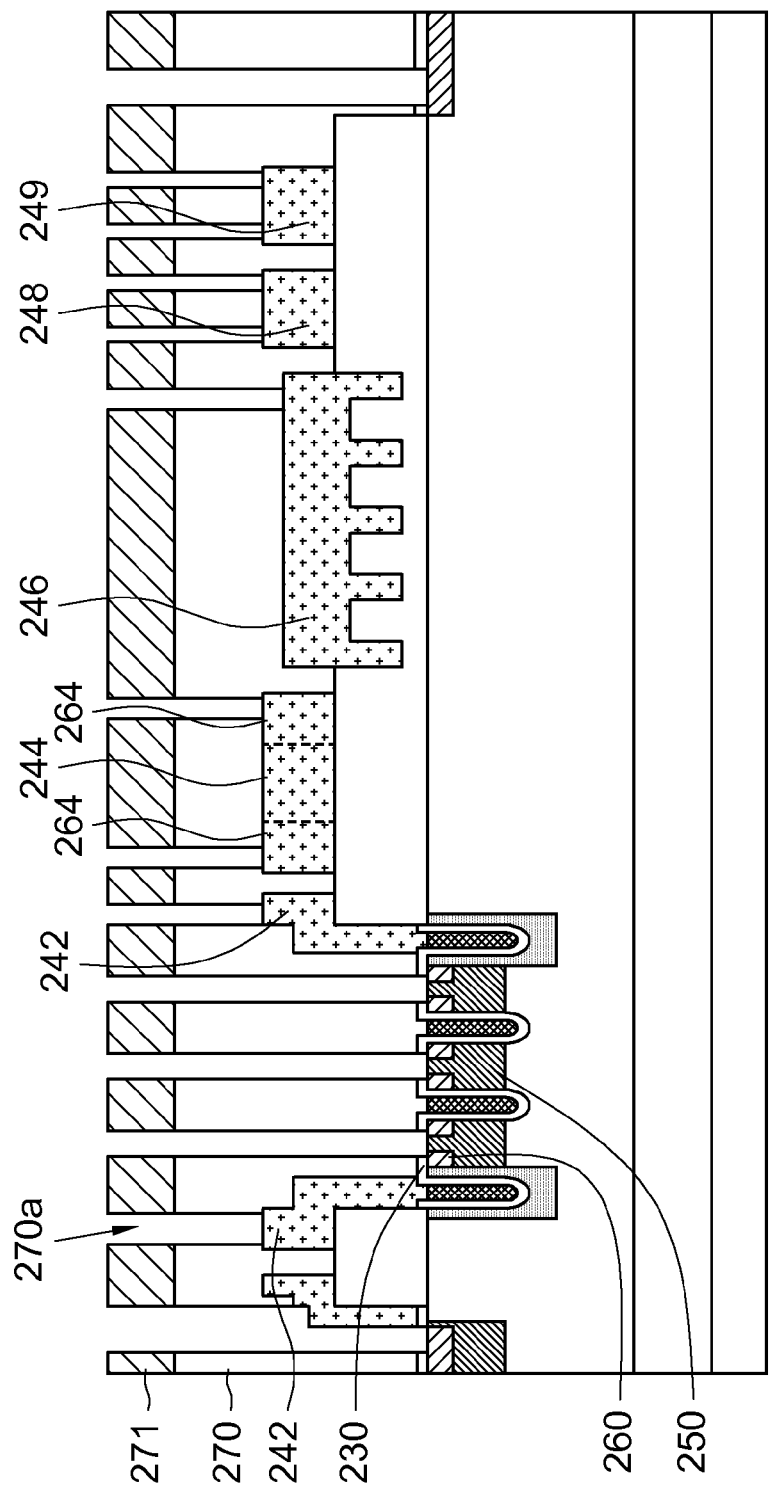

Afterwards, the patterned mask 252 is removed, and then a drive-in step, e.g. heat up to 950° C. for 80 minutes, is performed. Referring to FIG. 2M, an interlayer dielectric 270 is formed on the substrate 208 and then be etched while covering the patterned photoresist 271. The gate oxide layer 230 is also etched while covering the patterned photoresist 271. Many contact holes 270a are formed in the interlayer dielectric 270 to expose the surface of the doped polysilicon layer 242/264/246/248/249 and p-body 250, as shown in FIG. 2M. After removed the patterned photoresist 271, p-type dopant, e.g., $BF_2$, is implanted to the exposed p-body 250, especially at the place between the heavily n-doped regions 260. The implantation energy is about 50 KeV, and the implantation dosage is about $1.5 \times 10^{15}$ atom/cm². A rapid thermal annealing (RTA), such as heat up to 1000° C. for 30 seconds, is performed to activate the dopant. Steps of clean and reflow, i.e. heat up to 900° C., are sequentially performed to round the corner of the interlayer dielectric 270. It allow the contact holes 270a to be filled with metal more easily.

Figure 2N:
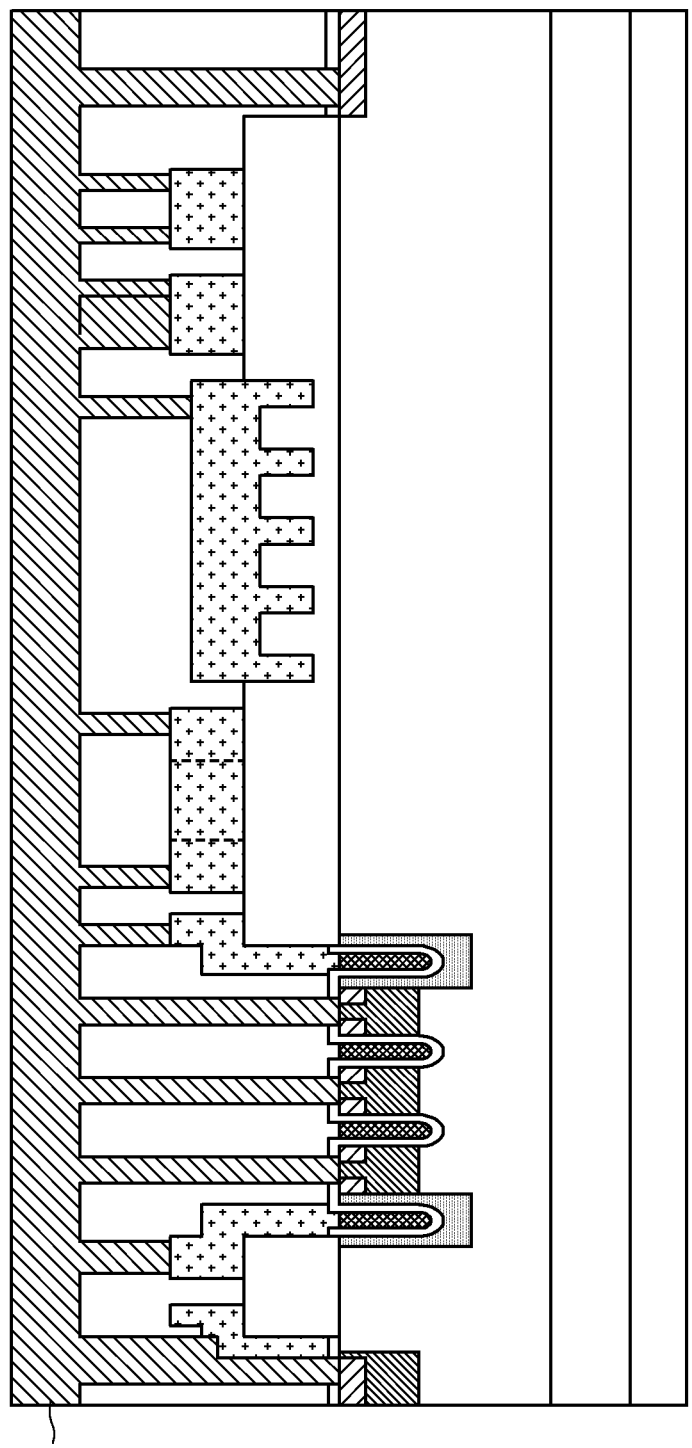
Figure 20:
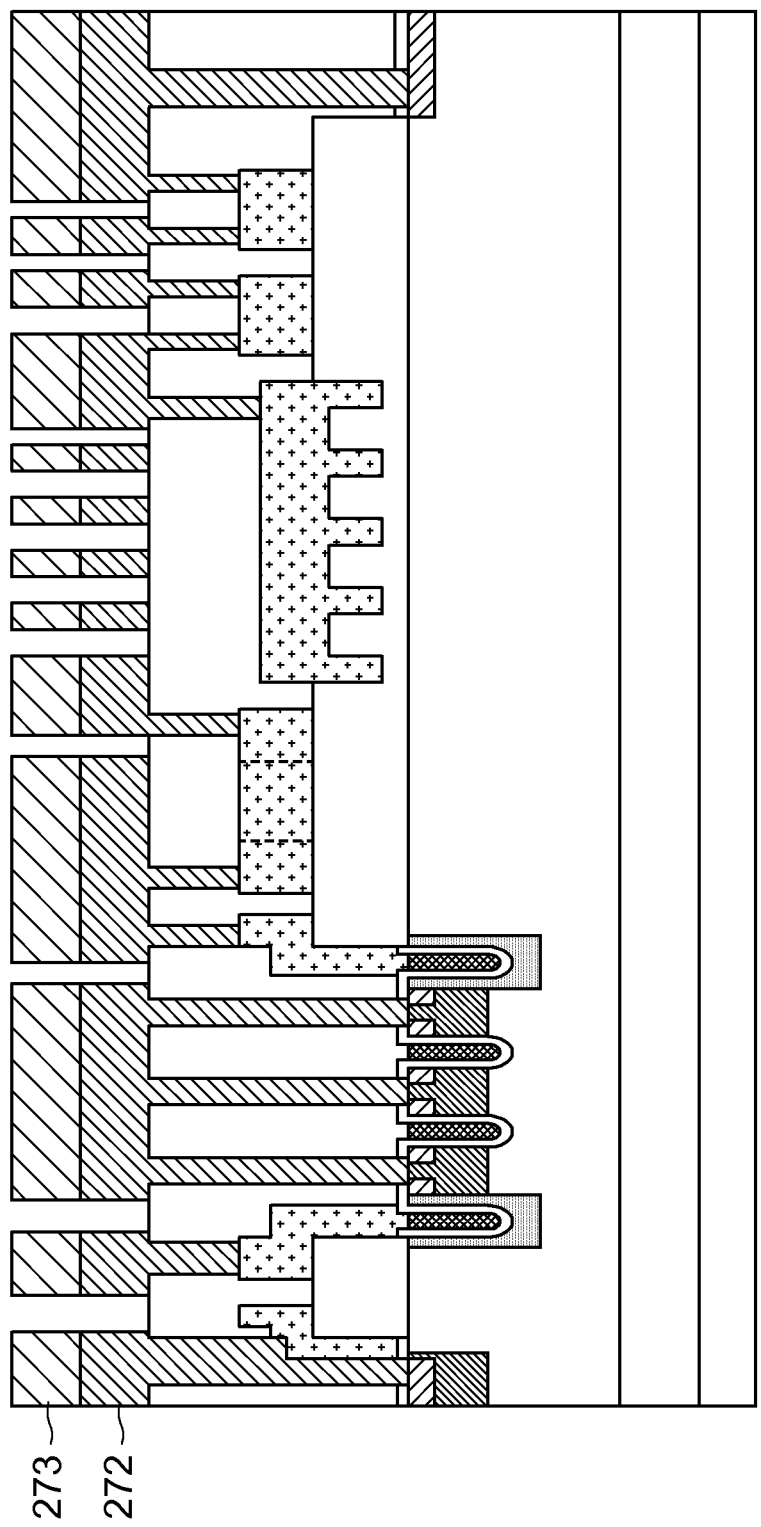
Figure 2P:
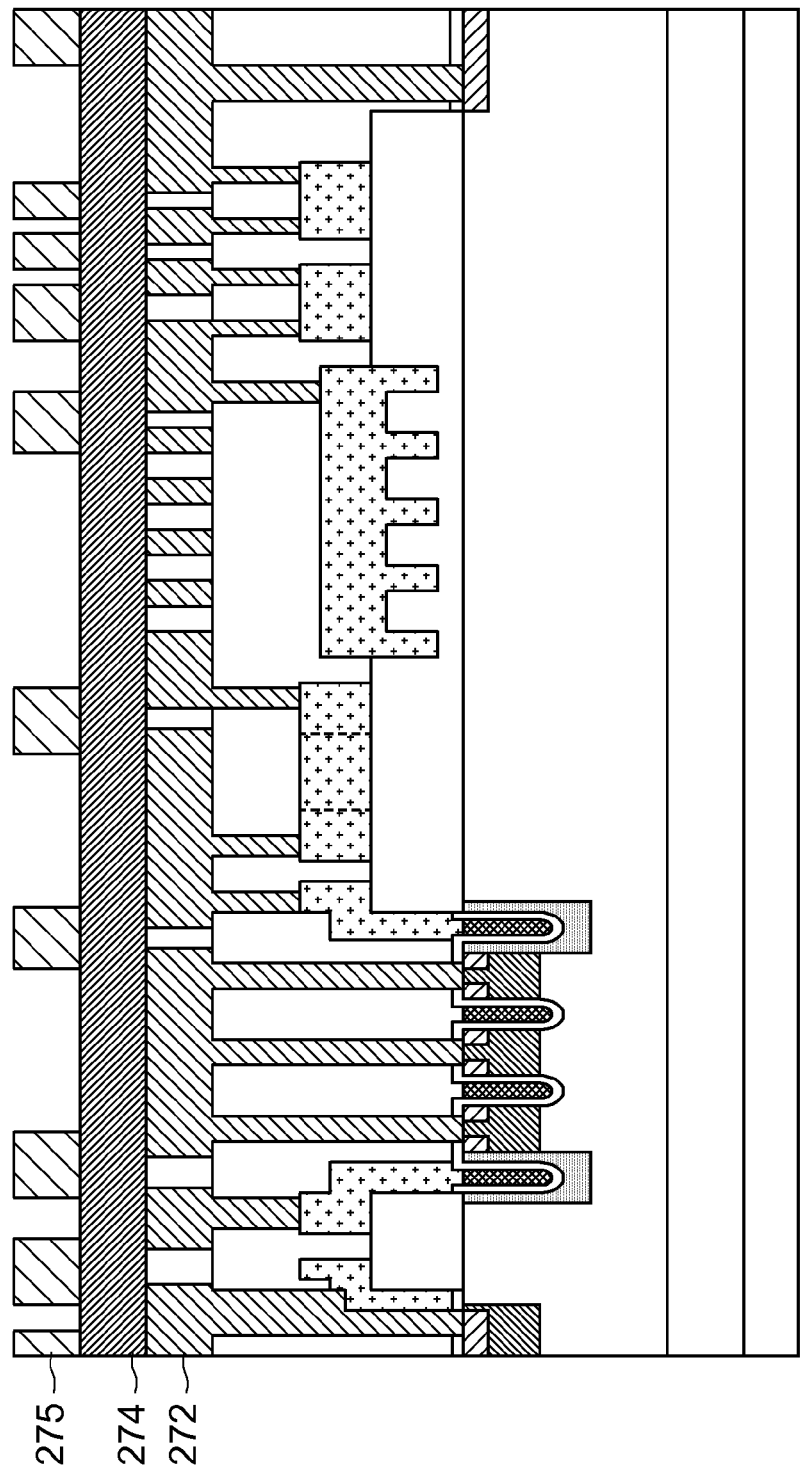

Next, the oxide layer generated from the step of reflow is etched by buffer oxide etchant. A layer of Ti/TiN (not shown) is sputtered, which serves as barrier layer. The Ti/TiN layer is formed along the surface of the interlayer dielectric 270, and the doped polysilicon layer 242/264/246/248/249 and the p-body 250, and then a post-metal rapid thermal process, e.g. heat up to 600° C. for 30 seconds, is performed. Referring to FIG. 2N, a metal layer 272, such as Al and Cu, is sputtered, and the contact holes are filled with the metal layer 272 and formed on the surface of the interlayer dielectric 270. The thickness of the metal layer 272 is preferably 3 µm. As shown in FIG. 2O, the metal layer 272 is etched while covering by a patterned photoresist 273, so that to several conducting lines and the connection among the units are formed. If the pattern of mask 272 is changed, the layout of the integrated device (as numerical 200 in FIG. 2Z) will be different, as disclosed in other embodiments of the present invention. On the other hand, the metal layer 272 is also serves as back-plate of microphone, and it provides sufficient support of the microphone owing to its thickness.

Figure 2Q:
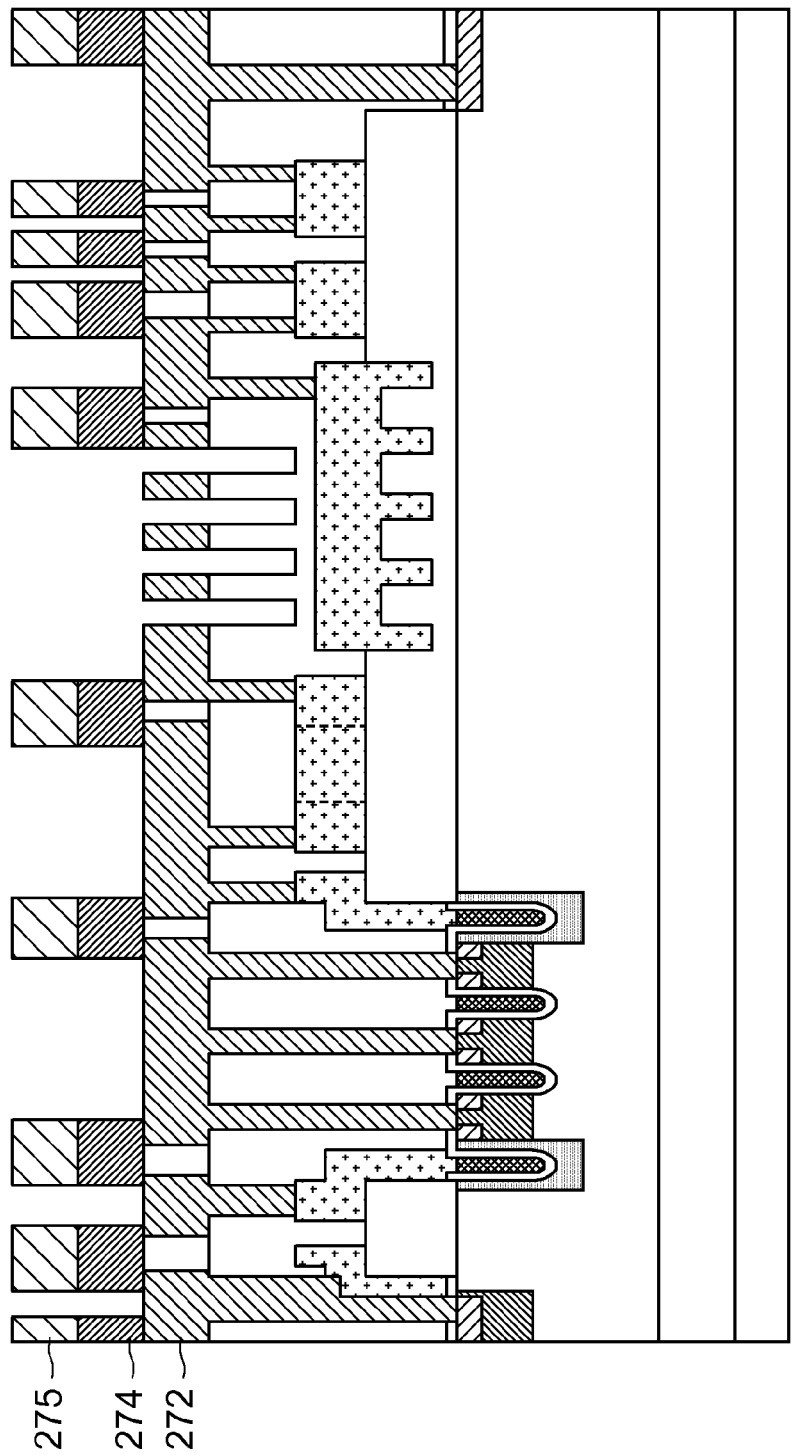
Figure 2R:
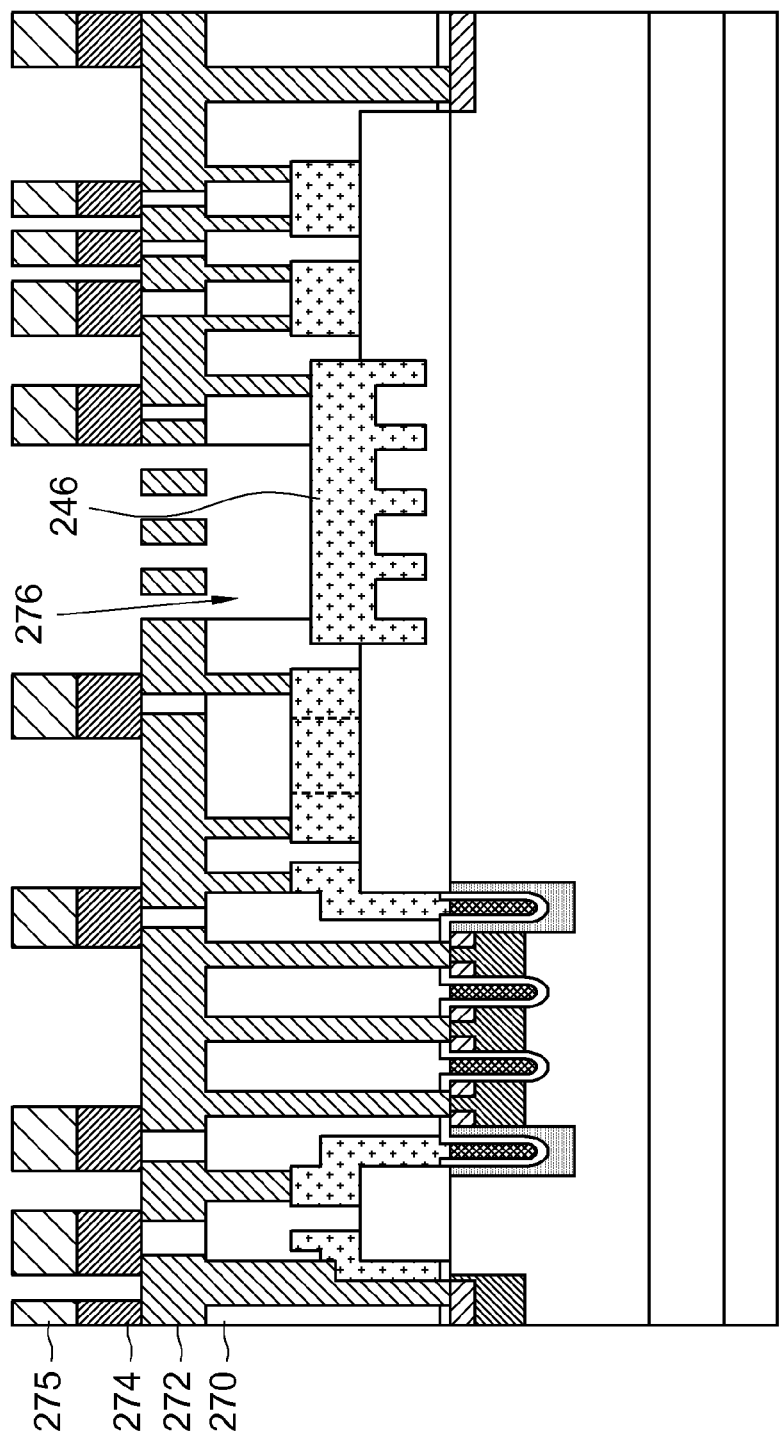

A protection layer 274, preferably including a plasma-enhanced oxide(PEOX), sub-atmosphere undoped silicon glass (SAUSG) and plasma enhanced silicon nitride(PESIN), is formed on the patterned metal layer 270, and then heated up to 400-450° C. for 30 minutes. The protection layer 274 is dry etched while masking by the patterned photoresist 275 to define pad open region. The etching step is stopped on the metal layer 272. It is noted that the interlayer dielectric 270 under the exposed apertures of the metal layer is partially etched, as shown in FIG. 2Q, since they are not masked by the photoresist 275 or the metal layer 272. Then, a step of wet etching is further performed to remove the interlayer dielectric 270 stacked on n-doped polysilicon layer 246, which serves as diaphragm of the microphone, as shown in FIG. 2R. It allows the diaphragm of the microphone to be partially released.

Figure 2S:
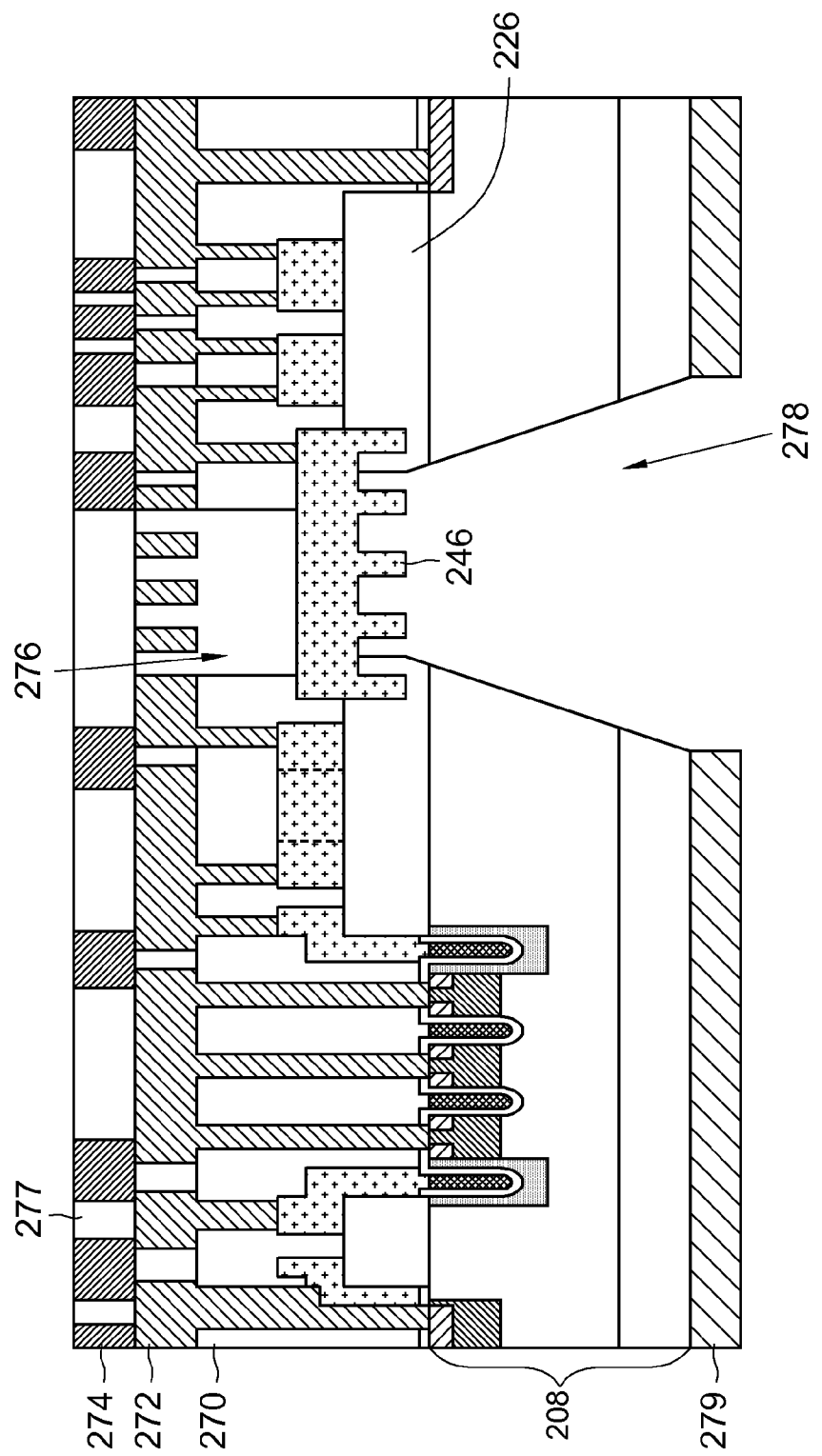
Figure 2T:
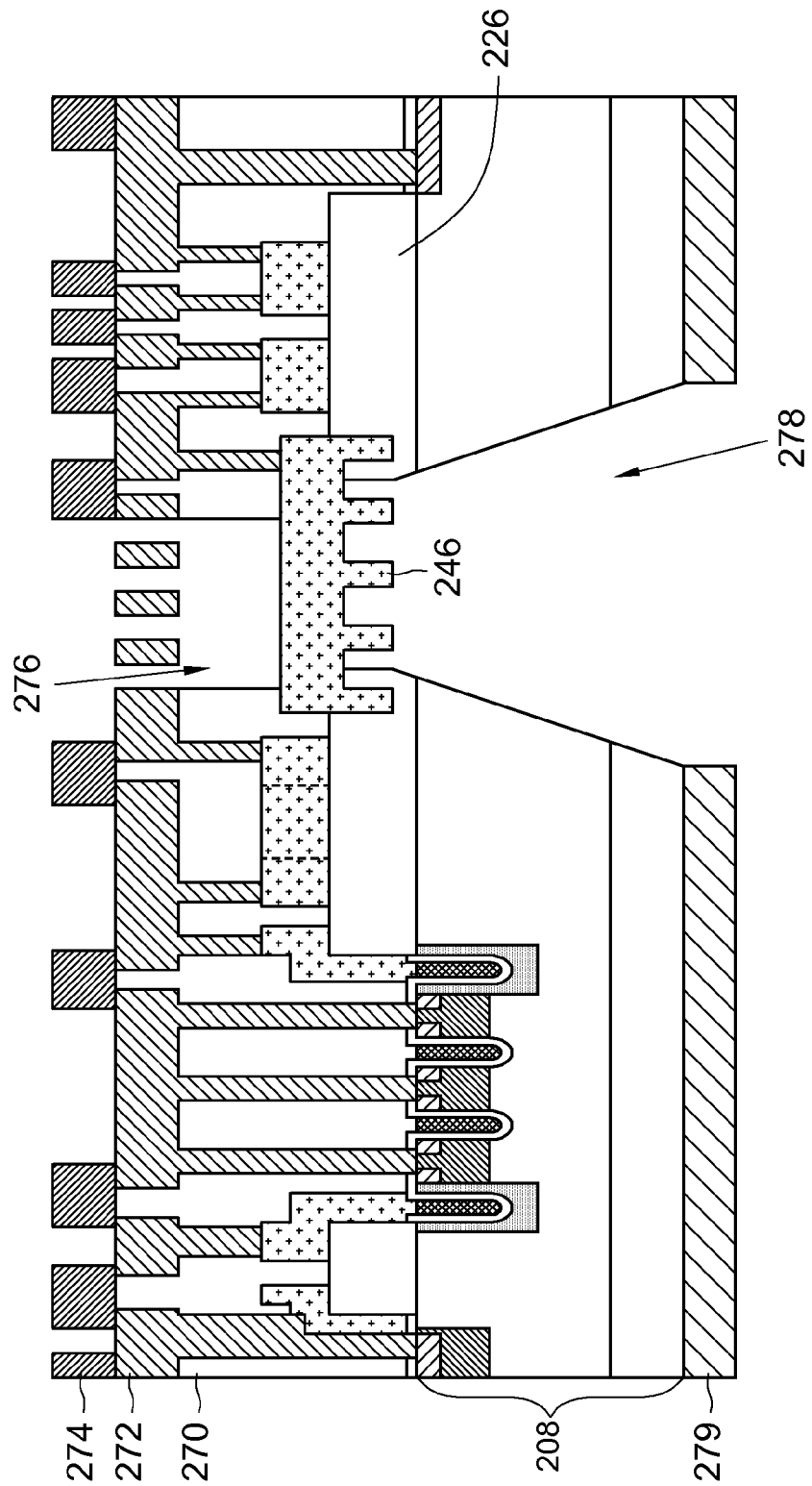
Figure 2U:
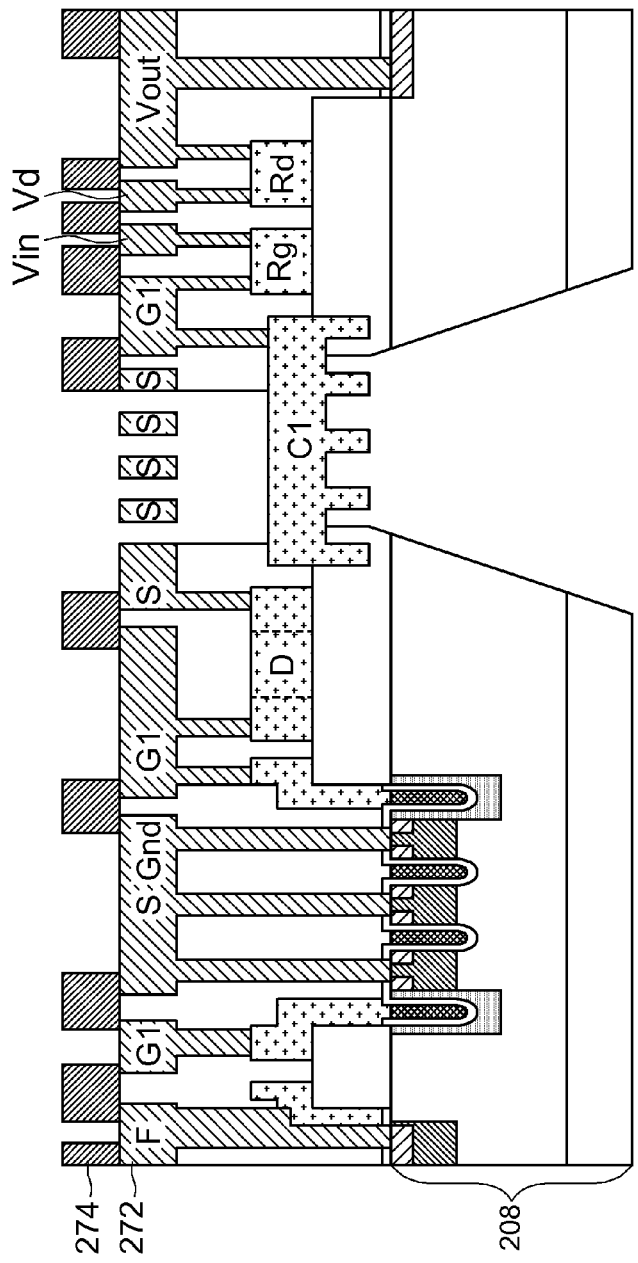

A wafer acceptance test (WAT) is performed to check the electrical characteristic of the device. The front side of the integrated semiconductor device 200 is covered with a blue tape 277, as shown in FIG. 2S. The back side of the semiconductor device 200 is grinded to remove part of the substrate 208 and then polished. The backside is also wet etched and cleaned to release stress of the substrate 208. Next, the backside of the substrate 208 is etched while masked by the patterned photoresist layer 279 by induced couple plasma (ICP), as shown in FIG. 2S. The etched substrate 208 has an aperture 278 to expose the oxide layer 226. The exposed oxide layer 226 is further etched by the reactive ion etch (RIE), and this etching step stops until the polysilicon layer 246 appears. As shown in FIG. 2T, the polysilicon layer 246 which serves as diaphragm of the microphone is fixed at two ends but released in the middle such that in possession of function of vibration. It is noted that the corrugation 229 of the oxide layer 226 (see FIG. 2D) gives the shaped of the polysilicon layer 246 deposited thereon, as a result of great stability of the diaphragm while vibration. An extra step is not needed to give shape of the polysilicon layer 246, because the corrugation 229 of the oxide layer can be simultaneously formed during formation of silicon trench 228, which is a used step in the semiconductor fabrication.

Figure 3:
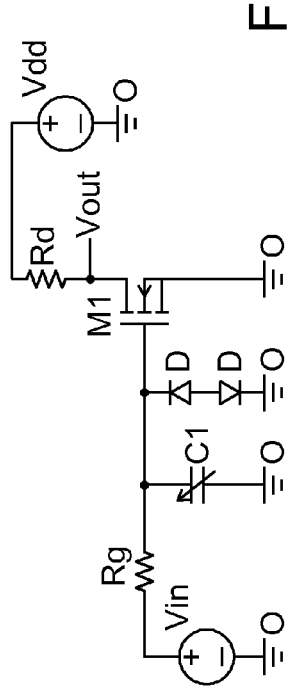
FIG. 3 shows the circuit of the integrated semiconductor device according to the second embodiment of the present invention.

After removing the patterned photoresist layer 279, the integrated semiconductor device 200 is completed, as shown in FIG. 2U. FIG. 3 shows the circuit of the integrated semiconductor device according to the second embodiment of the present invention. Referring to FIG.2U and FIG. 3, the semiconductor unit, e.g. MOSFET, is a common source pre-amplifier. The capacitor (C1) 246 is parallel with biasing resistor (Rg) 248 of the microphone. Several MOSFET are parallel with each other, in which source regions are electrically connected and drain regions are electrically connected, so that the channel width can be increased and the effect of amplification can be improved.

Figure 4A:
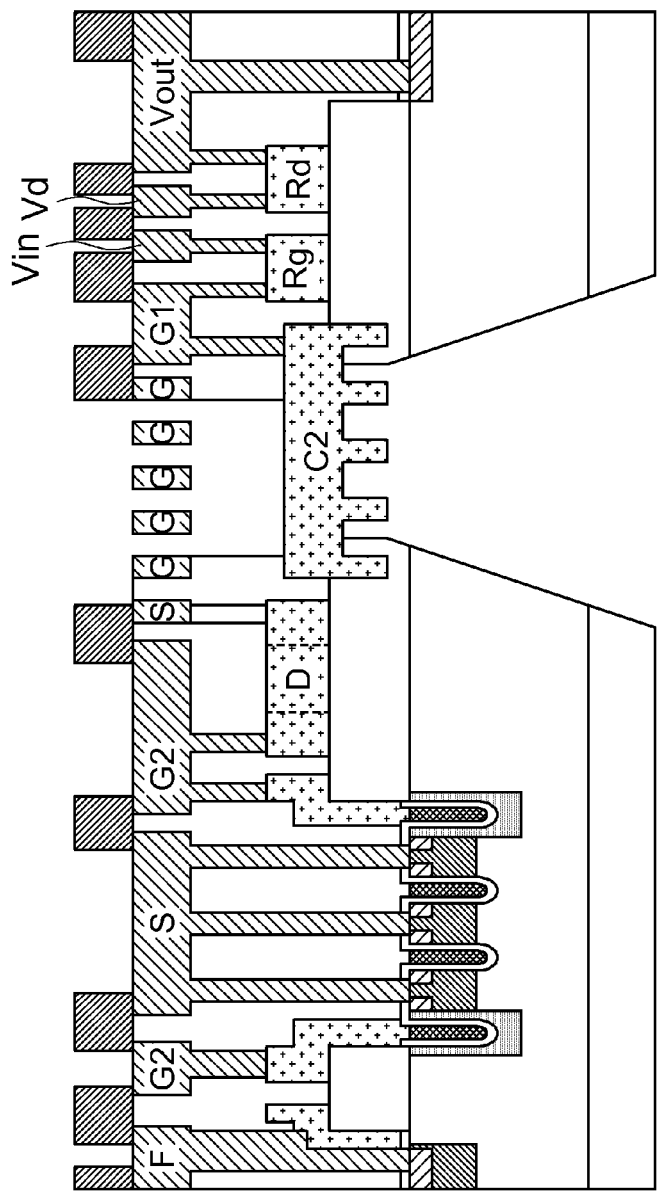
FIG. 4A schematically illustrates the cross section of the integrated semiconductor device according the first example derived from the second embodiment of the present invention.
Figure 4B:
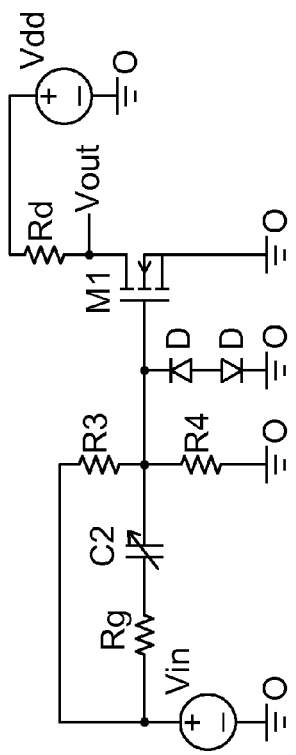
FIG. 4B shows the circuit of the integrated semiconductor device of FIG. 4A.

The circuit layout of the integrated semiconductor device can be varied with the pattern of the metal layer 272 and the conducting lines connected therebetween. When the pattern of the metal layer 272 and the electrical connection between elements is changed, the circuit layout of the device is changed accordingly. Thus, the method disclose above can be applied to various semiconductor device. At least another three circuits of the integrated semiconductor device are embodied as following. Referring to FIGS. 4A and 4B, FIG. 4A schematically illustrates the cross section of the integrated semiconductor device according the first example derived from the second embodiment of the present invention, FIG. 4B shows the circuit of the integrated semiconductor device of FIG. 4A. The integrated semiconductor device 300 has similar structure to the integrated semiconductor device 200 except for the electrical connection between the capacitor (C2) and the resistor (Rg). The MOSFET is also a common source pre-amplifier, but the capacitor (C2) connects serial with the biasing resistor (Rg) of microphone.

Figure 5A:
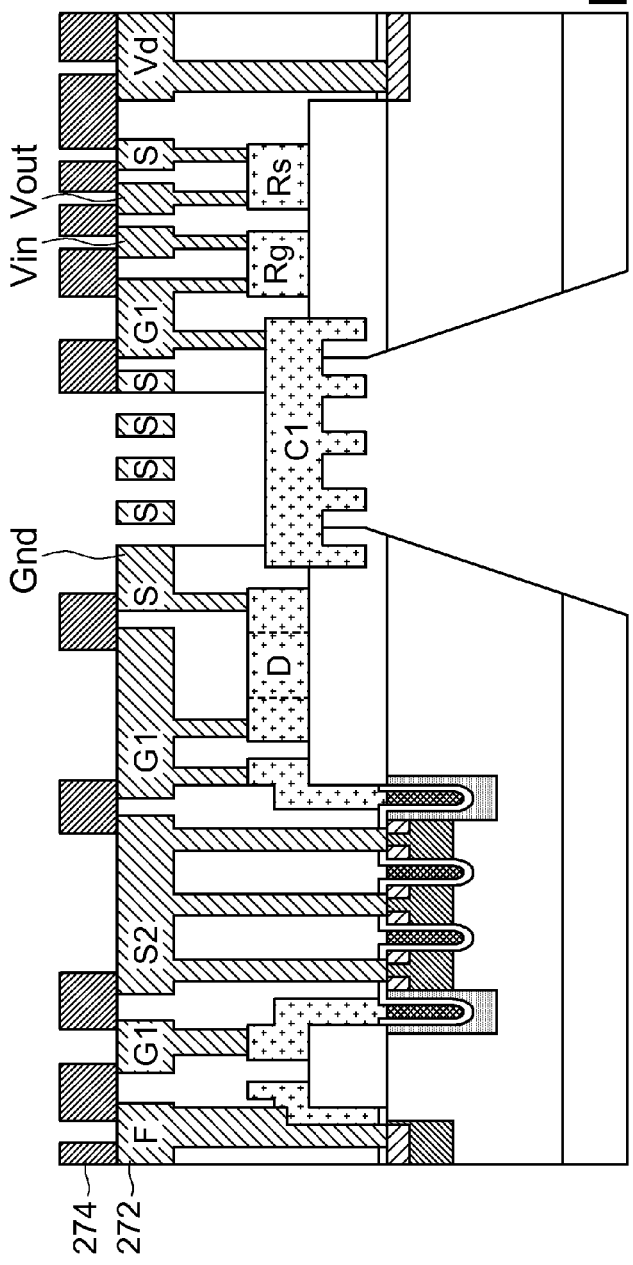
FIG. 5A schematically illustrates the cross section of the integrated semiconductor device according the second example derived from the second embodiment of the present invention.
Figure 5B:
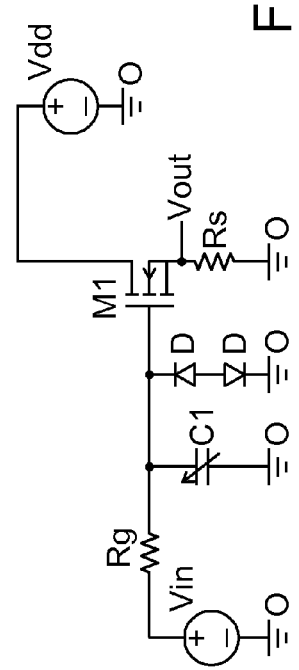
FIG. 5B shows the circuit of the integrated semiconductor device of FIG. 5A.

Referring to FIGS. 5A and 5B, FIG. 5A schematically illustrates the cross section of the integrated semiconductor device according the second example derived from the second embodiment of the present invention, and FIG. 5B shows the circuit of the integrated semiconductor device of FIG. 5A. The integrated semiconductor device 400 has similar structure to the integrated semiconductor device 200 except for the pattern of the metal layer 272, and protection layer 274. In this example, the MOSFET is a source follower pre-amplifier. The capacitor (C1) also connects parallel with the biasing resistor (Rg) of microphone.

Figures 6A, 6B:
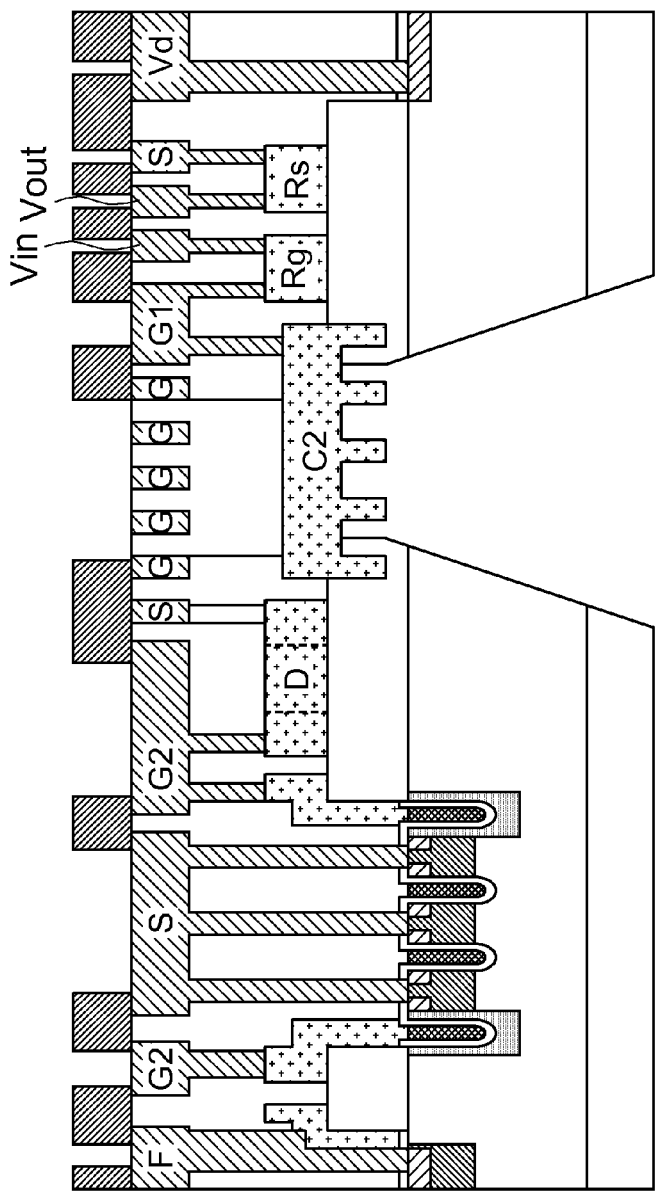
FIG. 6A schematically illustrates the cross section of the integrated semiconductor device according the second example derived from the second embodiment of the present invention.
FIG. 6B shows the circuit of the integrated semiconductor device of FIG. 6A.

Referring to FIGS. 6A and 6B, FIG. 6A schematically illustrates the cross section of the integrated semiconductor device according the second example derived from the second embodiment of the present invention, and FIG. 6B shows the circuit of the integrated semiconductor device of FIG. 6A. The integrated semiconductor device 500 has similar structure to the integrated semiconductor device 400 except for the electrical connection between the capacitor (C2) and the resistor (Rg). The MOSFET is also a common source pre-amplifier, but the capacitor (C2) connects serial with the biasing resistor (Rg) of microphone.

The method described above integrates the MEMS fabrication into the semiconductor fabrication. Some steps are used step in the semiconductor fabrication, and they also construct the MEMS unit or benefit the function of MEMS unit. For example, formation of silicon trench 228 is a used step of the semiconductor fabrication, and it also gives shape of corrugation 229 of the polysilicon layer 246 (see 246 of FIG. 2T), which is formed on the corrugation and serves as diaphragm of the microphone. The shape renders the diaphragm being stable while vibration. Formation of the metal layer 272 for connection is a used step of the semiconductor fabrication, and it also constructs the back-plate of the MEMS unit. Accordingly, the semiconductor fabrication and the MEMS fabrication can be integrated as disclosed above, and the semiconductor unit and the MEMS unit are formed on one chip by one process.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An integrated semiconductor device, comprising:
a substrate having a first region and a second region, wherein the first region and the second region are non-overlapping;
a semiconductor unit formed on the first region; and
a micro electro mechanical system (MEMS) unit formed on the second region, wherein the MEMS unit comprises a microphone comprising:
a semiconductor diaphragm having a first diaphragm surface having a plurality of cavities formed in only a partial thickness of the semiconductor diaphragm and exposed to air, and a second diaphragm surface without a cavity and opposite to the first diaphragm surface;
an interlayer dielectric disposed on the second diaphragm surface of the semiconductor diaphragm; and
a metal layer disposed on the interlayer dielectric, wherein the second diaphragm surface of the semiconductor diaphragm is exposed to an opening passing through the interlayer dielectric and the metal layer.

2. The device according to claim 1, wherein the semiconductor unit is formed by a high voltage fabrication.

3. The device according to claim 1, wherein the semiconductor unit comprises a pre-amplifier, the semiconductor diaphragm is supported by an oxide layer.

4. The device according to claim 1, wherein the semiconductor diaphragm comprises polysilicon.

5. The device according to claim 1, wherein the microphone further comprises an oxide layer supporting the semiconductor diaphragm from the first diaphragm surface of the semiconductor diaphragm.

6. The device according to claim 1, wherein the microphone further comprises an oxide layer supporting the semiconductor diaphragm and filling into only a portion of the plurality of cavities.

7. The device according to claim 1, wherein the microphone further comprises an oxide layer between the substrate and semiconductor diaphragm, the plurality of the cavities is communicated with an aperture passing through the oxide layer and the substrate.

* * * * *